United States Patent
Nakabayashi et al.

(10) Patent No.: US 11,189,758 B2
(45) Date of Patent: Nov. 30, 2021

(54) LIGHT-EMITTING DEVICE

(71) Applicant: NICHIA CORPORATION, Anan (JP)

(72) Inventors: Takuya Nakabayashi, Tokushima (JP); Yukiko Yokote, Anan (JP); Tadaaki Ikeda, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/519,809

(22) Filed: Jul. 23, 2019

(65) Prior Publication Data
US 2020/0035874 A1   Jan. 30, 2020

(30) Foreign Application Priority Data
Jul. 24, 2018  (JP) .............................. JP2018-138349

(51) Int. Cl.
  *H01L 33/50* (2010.01)
  *H01L 33/10* (2010.01)
  (Continued)

(52) U.S. Cl.
  CPC .............. *H01L 33/504* (2013.01); *F21K 9/61* (2016.08); *F21K 9/68* (2016.08); *H01L 25/0753* (2013.01); *H01L 33/10* (2013.01); *H01L 33/50* (2013.01)

(58) Field of Classification Search
  CPC ....... H01L 33/50; H01L 33/504; H01L 33/60; H01L 33/08; F21K 9/68
  See application file for complete search history.

(56) References Cited

U.S. PATENT DOCUMENTS

| 7,926,973 B2 * | 4/2011 | Harada ............... H01L 25/0753 362/231 |
| 2007/0126011 A1 | 6/2007 | Lee |

(Continued)

FOREIGN PATENT DOCUMENTS

| JP | 2007158296 A | 6/2007 |
| JP | 2012114176 A | 6/2012 |

(Continued)

*Primary Examiner* — Phat X Cao
(74) *Attorney, Agent, or Firm* — Hunton Andrews Kurth LLP

(57) ABSTRACT

A light-emitting device has a longitudinal direction and a width direction perpendicular to the longitudinal direction, and includes a first light-emitting element, a second light-emitting element having a peak emission wavelength different from a peak emission wavelength of the first light-emitting element and being aligned with the first light-emitting element in the longitudinal direction, a light-transmissive member covering a first element light extracting surface and a second element light extracting surface such that a portion of a light-guide member is located between the light-transmissive member and each of the first element light extracting surface and the second element light extracting surface, a first reflective member surrounding the first light-emitting element, the second light-emitting element, and the light-guide member in a top view, and a first inclined member between the first light-emitting element and the first reflective member in the longitudinal direction and having an inclined surface inclined relative to the light-transmissive member. The first inclined member is spaced apart from the light-transmissive member.

19 Claims, 14 Drawing Sheets

(51) Int. Cl.
  *F21K 9/68*       (2016.01)
  *F21K 9/61*       (2016.01)
  *H01L 25/075*     (2006.01)

(56) References Cited

U.S. PATENT DOCUMENTS

| | | | |
|---|---|---|---|
| 2014/0239332 A1 | 8/2014 | Iwakura et al. | |
| 2015/0085527 A1 | 3/2015 | Nam et al. | |
| 2017/0084587 A1* | 3/2017 | Hung | H01L 25/0753 |
| 2017/0229512 A1 | 8/2017 | Akagawa et al. | |
| 2017/0294561 A1* | 10/2017 | Ikeda | C09K 11/02 |
| 2019/0198722 A1* | 6/2019 | Nakabayashi | H01L 33/62 |

FOREIGN PATENT DOCUMENTS

| | | | |
|---|---|---|---|
| JP | 2012174968 A | 9/2012 | |
| JP | 2014195046 A | 10/2014 | |
| JP | 2015070273 A | 4/2015 | |
| JP | 2015173287 A | 10/2015 | |
| JP | 2016154179 A | 8/2016 | |
| JP | 2016225664 A | 12/2016 | |
| JP | 2017143253 A | 8/2017 | |
| JP | 2018019091 A | 2/2018 | |
| KR | 101504993 B1 | 3/2015 | |

\* cited by examiner

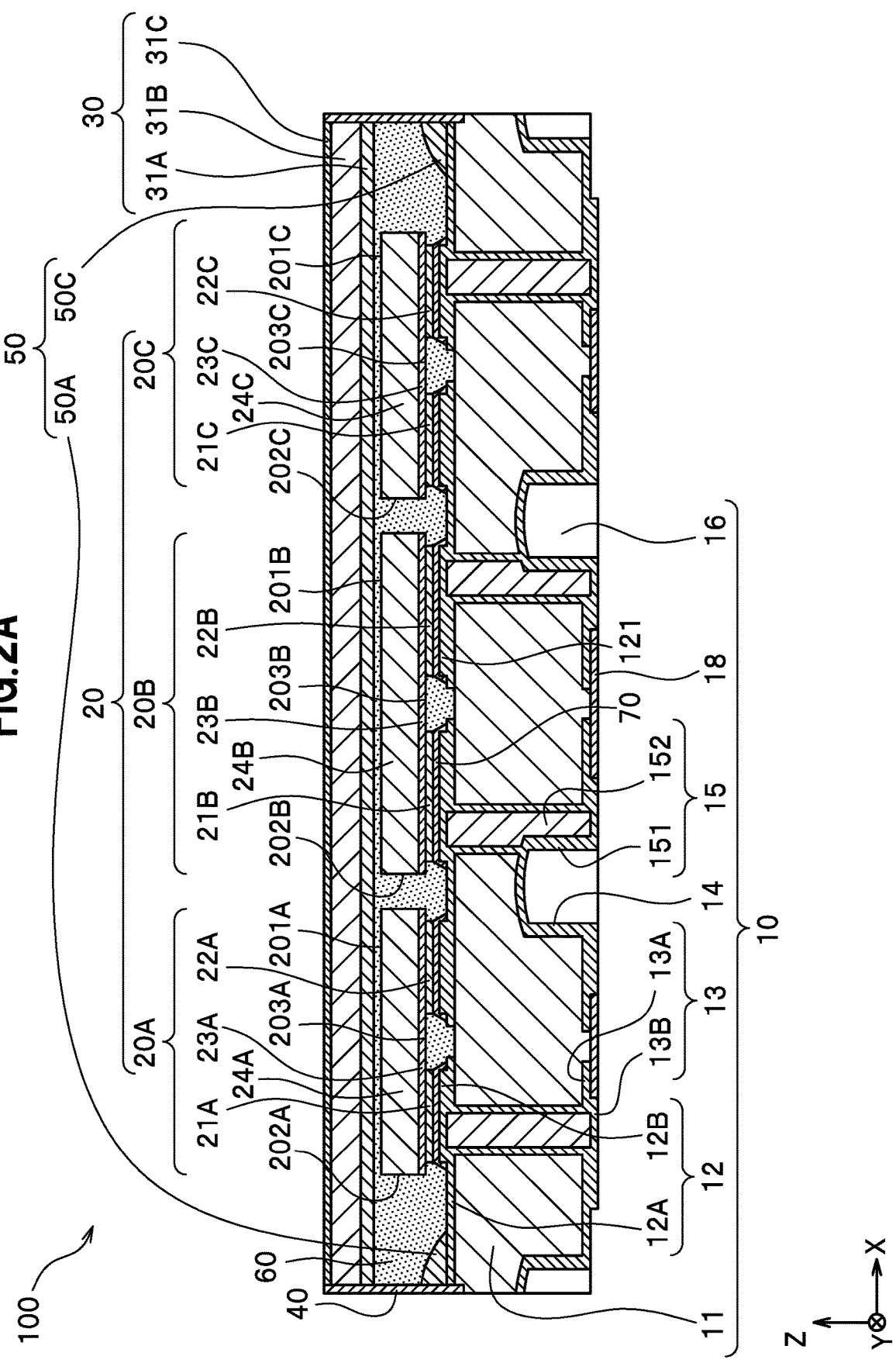

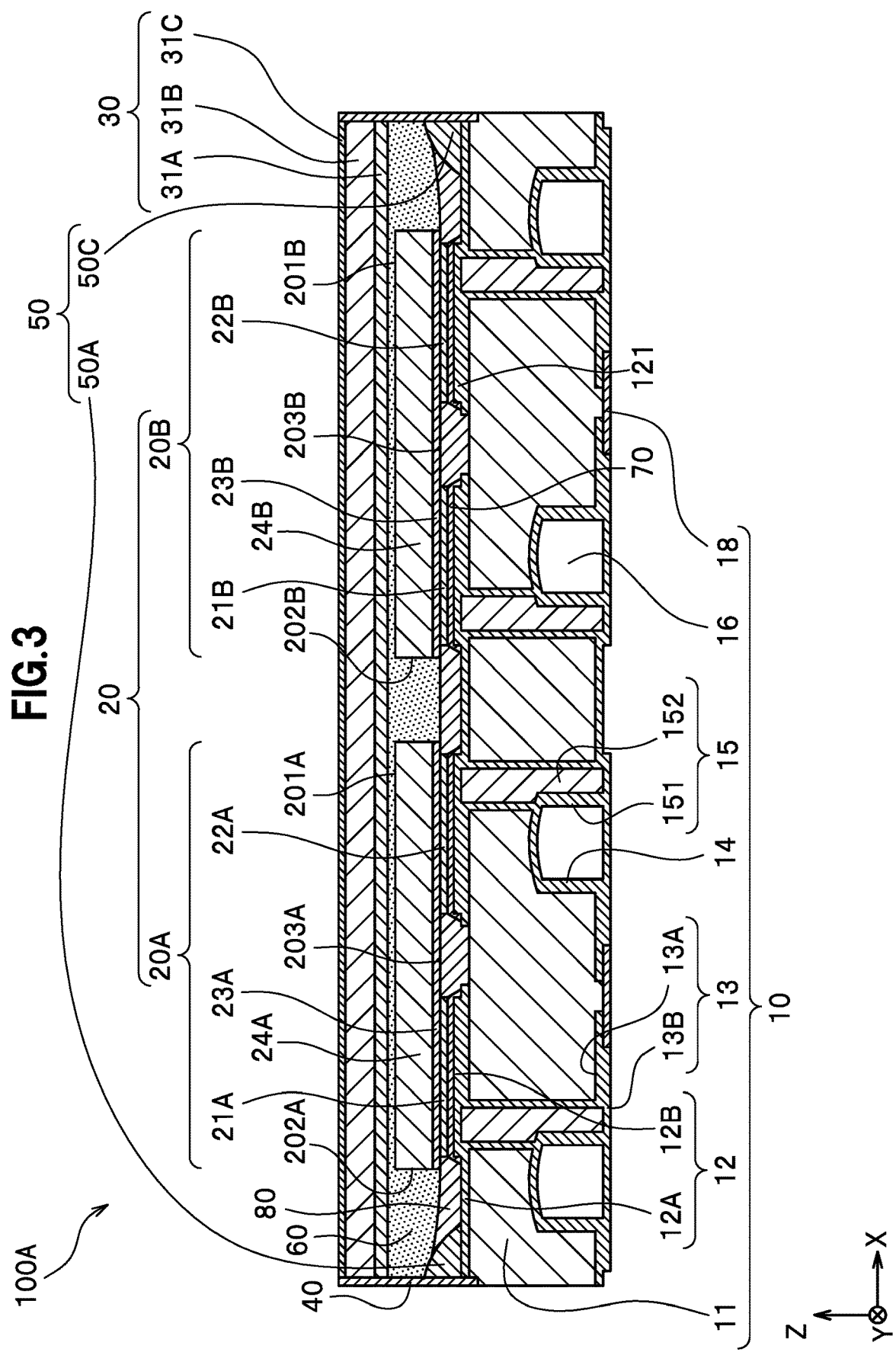

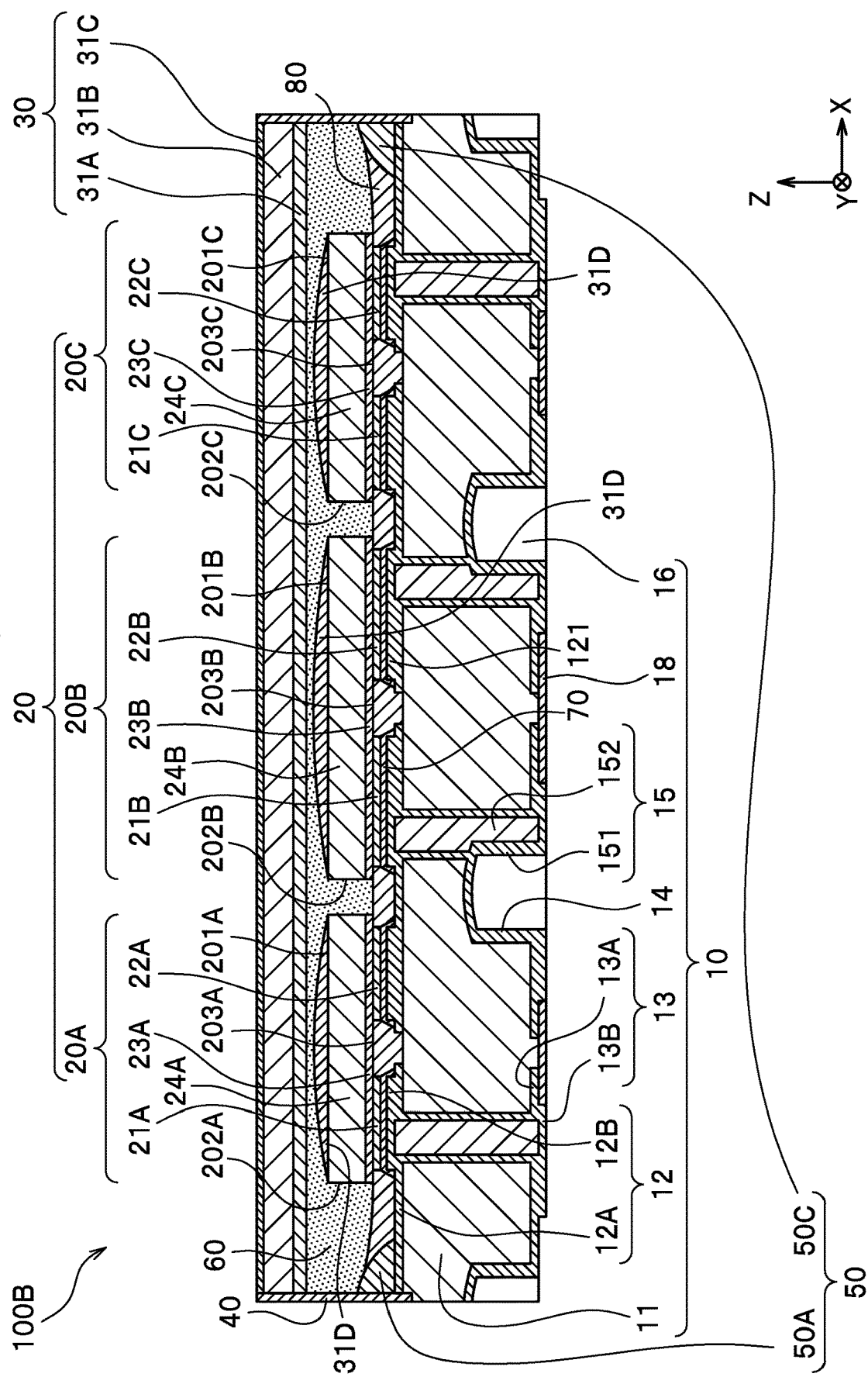

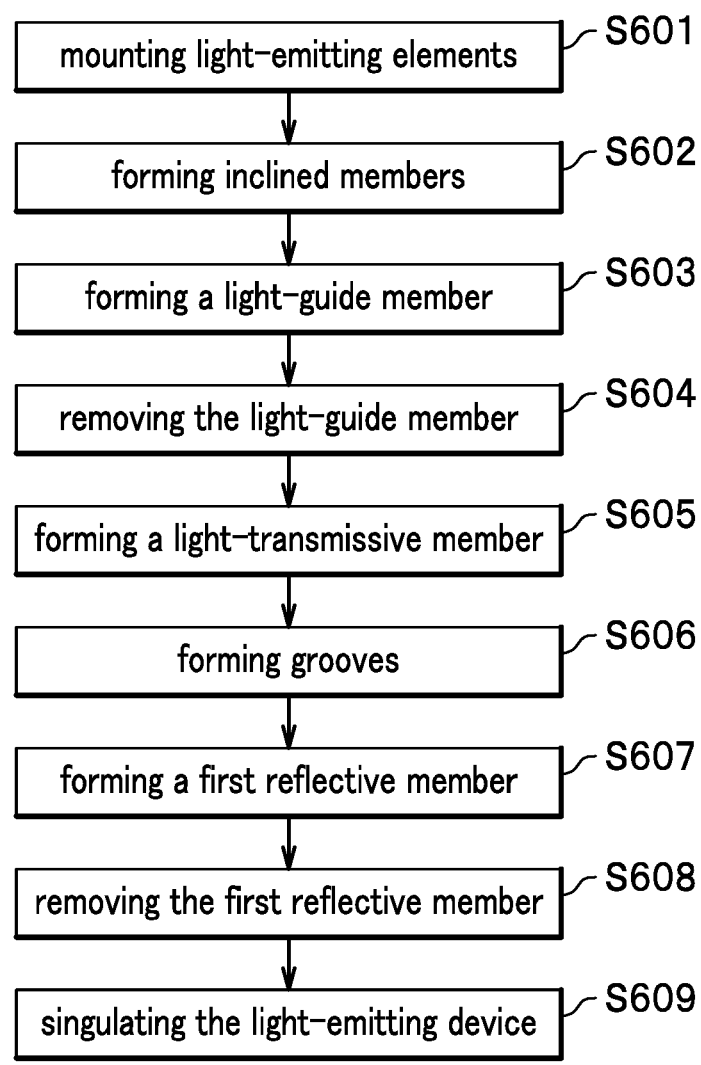

LIGHT-EMITTING DEVICE

CROSS-REFERENCE TO RELATED APPLICATION

This application claims priority to Japanese Patent Application No. 2018-138349, filed on Jul. 24, 2018, the contents of which are hereby incorporated by reference in their entirety.

BACKGROUND OF THE INVENTION

1. Field of the Invention

The present disclosure relates to a light-emitting device.

2. Description of Related Art

There have been known white light-emitting diodes including a blue light-emitting diode chip and a green light-emitting diode chip mounted on a first lead terminal and sealed by a molding member containing a red phosphor (for example, see Japanese Unexamined Patent Application Publication No. 2007-158296).

SUMMARY OF THE INVENTION

Improvement in the color mixing performance of a light-emitting device containing a plurality of light-emitting elements with different peak emission wavelengths is desired.

Certain embodiments of the present disclosure has an object to provide a light-emitting device with improved color mixing performance.

A light-emitting device according to one embodiment of the present disclosure has a longitudinal direction and a width direction perpendicular to the longitudinal direction, and includes: a first light-emitting element having a first element light extracting surface, a first element electrode formation surface opposite to the first element light extracting surface, and first element lateral surfaces between the first element light extracting surface and the first element electrode formation surface; a second light-emitting element having a second element light extracting surface, a second element electrode formation surface opposite to the second element light extracting surface, and second element lateral surfaces between the second element light extracting surface and the second element electrode formation surface, the second light-emitting element having a peak emission wavelength different from a peak emission wavelength of the first light-emitting element and being aligned with the first light-emitting element in the longitudinal direction; a light-guide member covering the first element light extracting surface, the first element lateral surfaces, the second element light extracting surface, and the second element lateral surfaces; a light-transmissive member covering the first element light extracting surface and the second element light extracting surface such that a portion of the light-guide member is located between the light-transmissive member and each of the first element light extracting surface and the second element light extracting surface; a first reflective member surrounding the first light-emitting element, the second light-emitting element, and the light-guide member in a top view; and a first inclined member disposed between the first light-emitting element and the first reflective member in the longitudinal direction and having an inclined surface inclined relative to the light-transmissive member. The first inclined member is spaced apart from the light-transmissive member.

In the light-emitting device according to certain embodiments of the present disclosure, color mixing performance can be improved.

BRIEF DESCRIPTION OF THE DRAWINGS

FIG. 2A is a schematic cross-sectional view taken along the line IIA-IIA of FIG. 1C.

FIG. 3 is a schematic cross-sectional view of a first modified example of the light-emitting device according to the first embodiment of the present disclosure.

FIG. 4 is a schematic cross-sectional view of a second modified example of the light-emitting device according to the first embodiment of the present disclosure.

FIG. 7 is a flowchart illustrating a method for manufacturing the light-emitting device according to the first embodiment of the present disclosure.

DETAILED DESCRIPTION OF EMBODIMENT

Figure 1A:
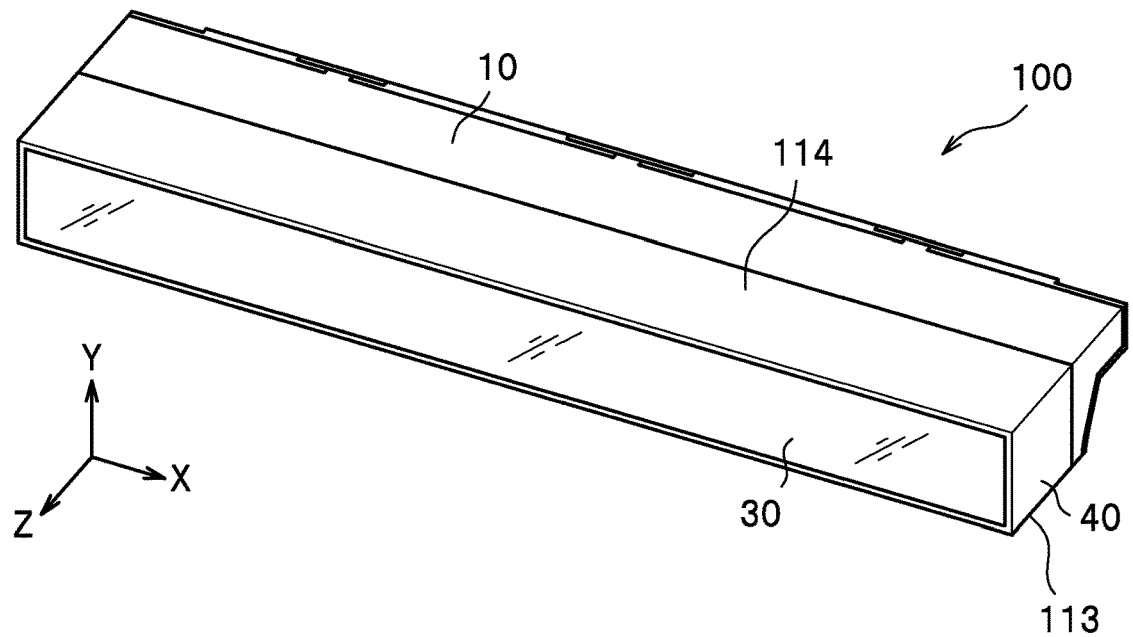
FIG. 1A is a schematic perspective view of a light-emitting device according to a first embodiment of the present disclosure.

A light-emitting device and a method for manufacturing the light-emitting device according to certain embodiments will be described below. The drawings referred to in the descriptions below schematically illustrate certain embodiments. The scales, the distances, the positional relationships, and the like of members may be exaggerated, or illustration of a part of the members may be omitted. Also, the scales or the distances of the members in a plan view may not be the same as the scales or the distances in a cross-sectional view. In the descriptions below, the same term or reference numeral generally represents the same member or a member made of the same material, and its detailed description will be omitted as appropriate. In addition, terms such as "up" and "down" in the present specification are not intended to represent absolute positions but represent relative positions of components. Constitutions described regarding a single embodiment are applicable to other embodiments and modified examples.

Structure of Light-Emitting Device

Figure 1B:
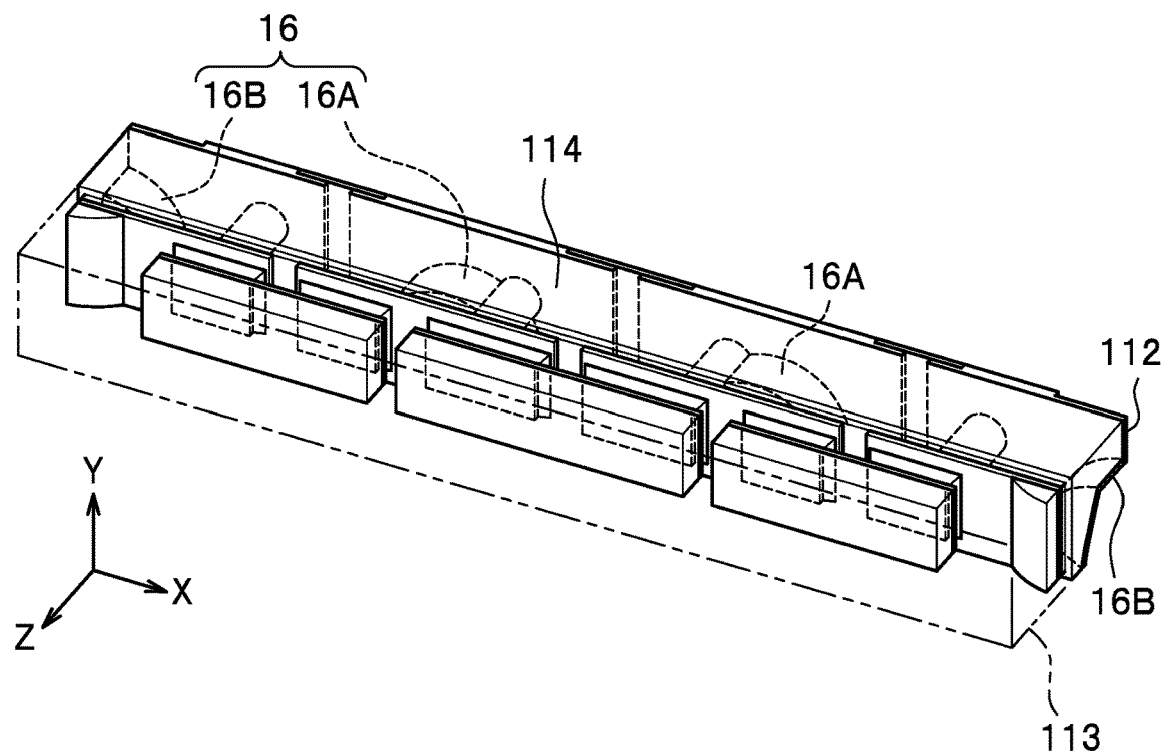
FIG. 1B is a schematic perspective transparent view of the light-emitting device according to the first embodiment of the present disclosure.
Figure 1C:
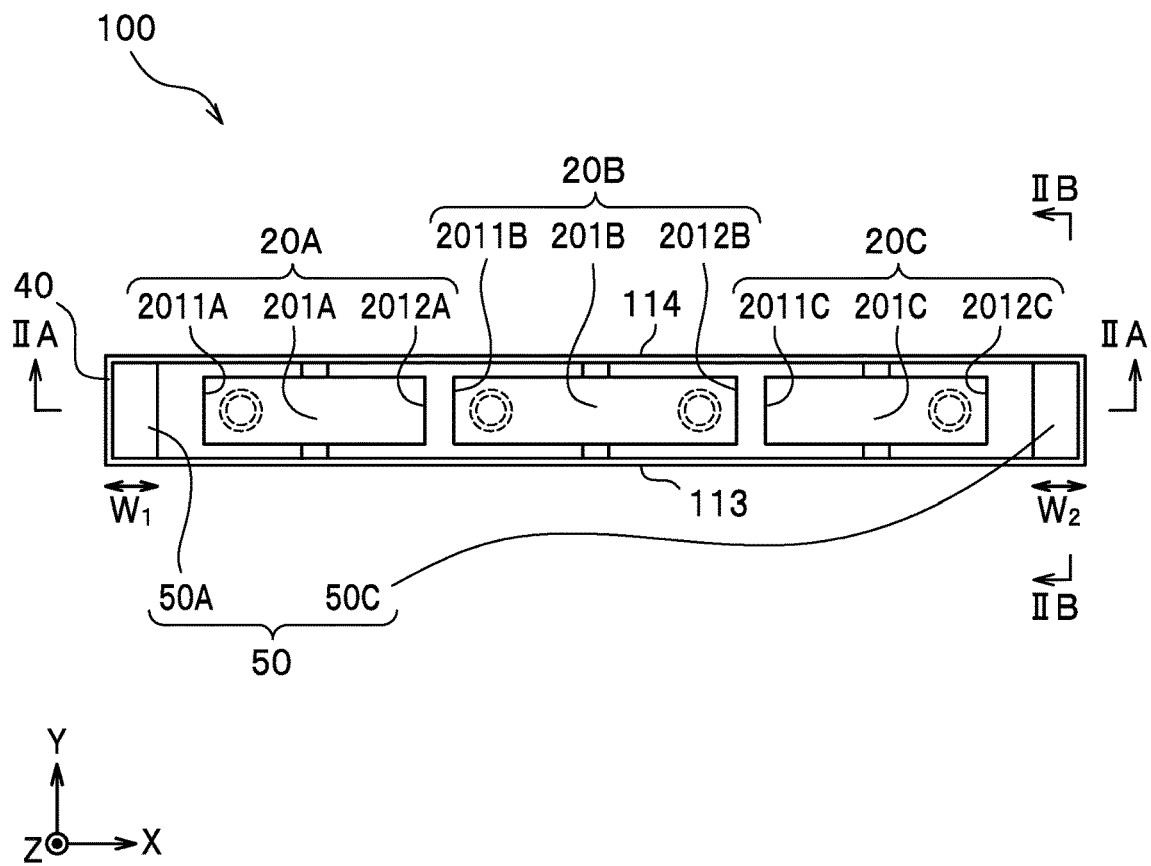
FIG. 1C is a schematic top view of the light-emitting device according to the first embodiment of the present disclosure.
Figure 2B:
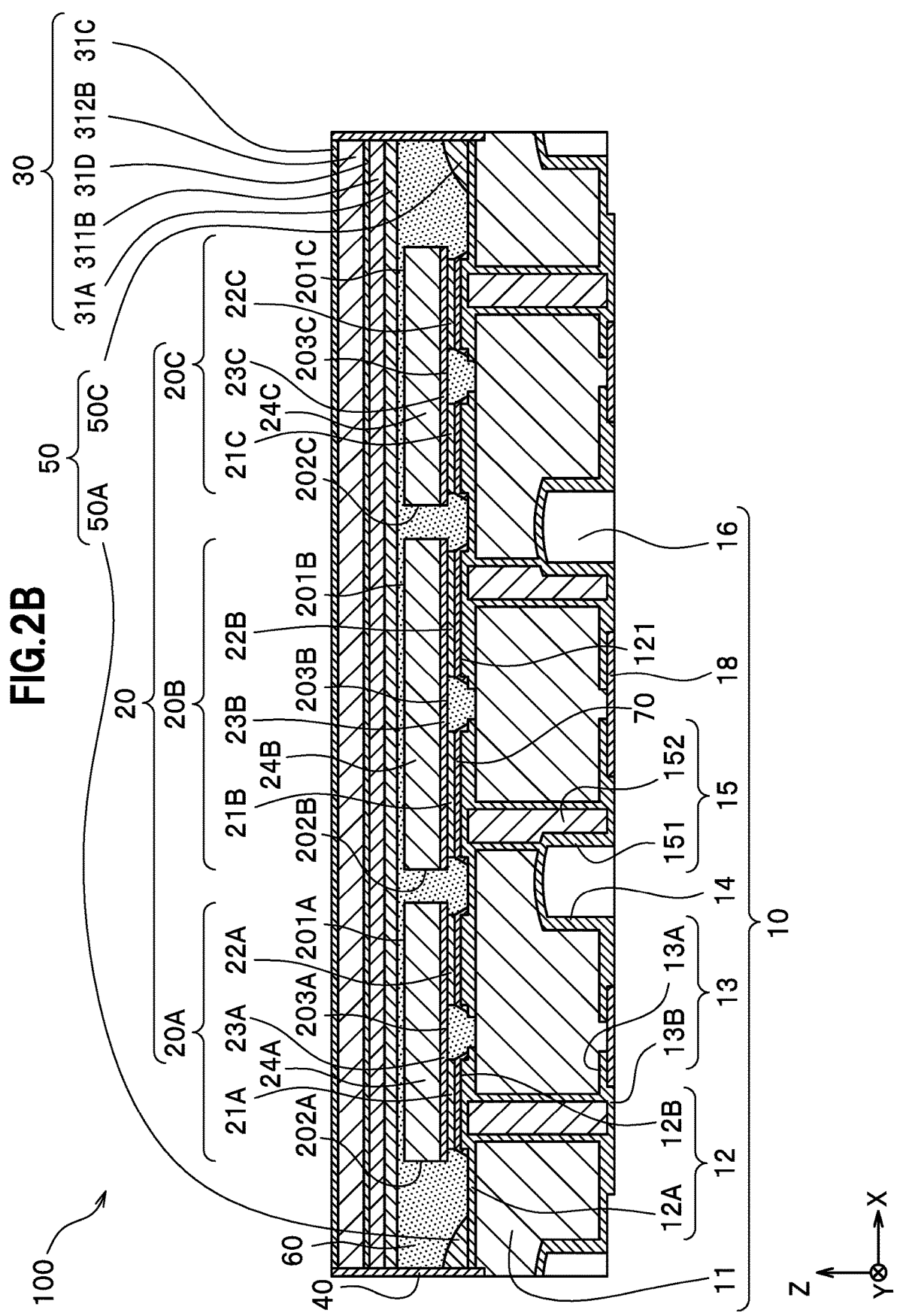
FIG. 2B is a schematic cross-sectional view taken along the line IIA-IIA of FIG. 1C.
Figure 2C:
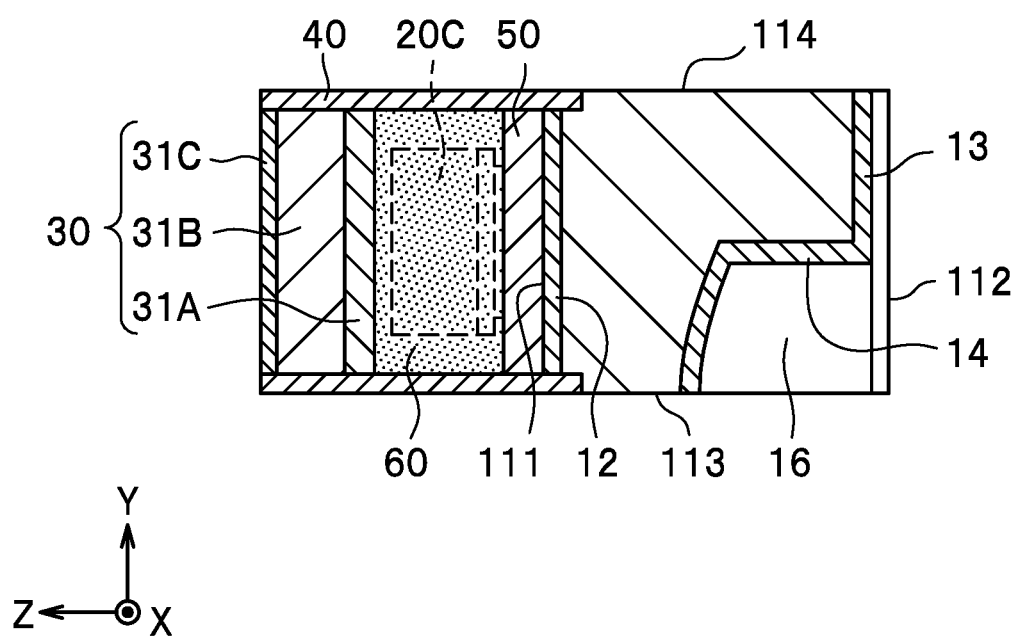
FIG. 2C is a schematic cross-sectional view taken along the line IIB-IIB of FIG. 1C.

First, the structure of a light-emitting device 100 according to the first embodiment will be described referring to FIG. 1A, FIG. 1B, FIG. 1C, FIG. 2A, and FIG. 2C. FIG. 1A is a schematic perspective view of the light-emitting device 100 according to the first embodiment. FIG. 1B is a schematic perspective view of the light-emitting device 100 according to the first embodiment. FIG. 1C is a schematic top view of the light-emitting device 100 according to the first embodiment. FIG. 2A is a schematic cross-sectional view for illustrating the structure of the light-emitting device 100 according to the first embodiment taken along the line IIA-IIA of FIG. 1C. FIG. 2C is a schematic sectional view for illustrating the structure of the light-emitting device 100 according to the first embodiment taken along the line IIB-IIB of FIG. 1C.

The light-emitting device 100 has a longitudinal direction (X direction shown in FIG. 1A to FIG. 1D) and a width direction (Y direction shown in FIG. 1A to FIG. 1D) perpendicular to the longitudinal direction and includes a first light-emitting element 20A, a second light-emitting element 20B, a third light-emitting element 20C, a light-transmissive member 30, a first reflective member 40, inclined members 50 (a first inclined member 50A and a third inclined member 50C), and a light-guide member 60. The inclined members 50 include the first inclined member 50A and the third inclined member 50C. The inclined members 50 also include a second inclined member described below. The light-emitting device 100 includes two or more light-emitting elements. The light-emitting device 100 includes three light-emitting elements: the first light-emitting element 20A, the second light-emitting element 20B, and the third light-emitting element 20C. Structure of the first light-emitting element 20A will be described below as an example of structures of the first light-emitting element 20A, the second light-emitting element 20B, and the third light-emitting element 20C.

The first light-emitting element 20A has a first element light extracting surface 201A, a first element electrode formation surface 203A opposite to the first element light extracting surface 201A, and first element lateral surfaces 202A between the first element light extracting surface 201A and the first element electrode formation surface 203A. The first element light extracting surface 201A is an upper surface of the first light-emitting element 20A. The "first element electrode formation surface 203A" refers to a bottom surface of the first light-emitting element 20A, and a plurality of first element electrodes 21A and 22A are disposed on the first element electrode formation surface 203A. The first element lateral surfaces 202A may be perpendicular or inclined inward or outward with respect to the first element light extracting surface 201A.

The first light-emitting element 20A includes a first element substrate 24A, a first element semiconductor layered body 23A in contact with the first element substrate 24A, and the plurality of first element electrodes 21A and 22A in contact with the first element semiconductor layered body 23A. In the first embodiment, an example of the structure in which the first light-emitting element 20A includes the first element substrate 24A is described, but the first element substrate 24A may be removed.

In the case where the first light-emitting element 20A includes the first element substrate 24A, the "first element light extracting surface 201A" refers to an upper surface of the first element substrate 24A opposite to the first element electrode formation surface 203A on which the plurality of first element electrodes 21A and 22A are disposed. In the case where the first light-emitting element 20A does not include the first element substrate 24A, the "first element light extracting surface 201A" refers to an upper surface of the first element semiconductor layered body 23A opposite to the first element electrode formation surface 203A on which the plurality of first element electrodes 21A and 22A are disposed.

The first light-emitting element 20A, the second light-emitting element 20B, and the third light-emitting element 20C are preferably aligned on a straight line in the longitudinal direction. With this structure, a thickness of the light-emitting device 100 can be reduced in the Y direction. In the case where the first element light extracting surface 201A of the first light-emitting element 20A has a rectangular shape in a top view, a first short side 2011A of the first element light extracting surface 201A faces the inclined member 50 (first inclined member 50A), and a second short side 2012A of the first element light extracting surface 201A faces a first short side 2011B of a second element light extracting surface 201B. In the case where the third light-emitting element 20C has a rectangular shape in a top view, a first short side 2011C of a third element light extracting surface 201C faces a second short side 2012B of the second element light extracting surface 201B, and a second short side 2012C of the third element light extracting surface 201C faces a corresponding one of the inclined members 50 (i.e., third inclined member 50C). With such a structure, the first light-emitting element 20A, the second light-emitting element 20B, and the third light-emitting element 20C are aligned in the X direction, so that a thickness of the light-emitting device 100 can be reduced in the Y direction. In other words, the second light-emitting element 20B is located between the first light-emitting element 20A and the third light-emitting element 20C.

The first light-emitting element 20A, the second light-emitting element 20B, and the third light-emitting element 20C preferably has a rectangular shape, particularly preferably a square shape or an elongated rectangular shape in a top view, but may have another shape.

The first element light extracting surface 201A, the second element light extracting surface 201B, and/or the third element light extracting surface 201C may be located at substantially the same height or different heights in the Z direction. For example, the first element light extracting surface 201A and the third element light extracting surface 201C are located at substantially the same heights, and the second element light extracting surface 201B may be located at a height different from the height at which the first element light extracting surface 201A and the third element light extracting surface 201C are located.

The first element electrodes 21A and 22A, second element electrodes 21B and 22B, and third element electrodes 21C and 22C can be made of a metal such as gold, silver, tin, platinum, rhodium, titanium, aluminum, tungsten, palladium, nickel, or an alloy of one or more of these metals.

It is preferable that the first element substrate 24A, a second element substrate 24B, and a third element substrate 24C be mainly crystal growth substrates on which semiconductor crystals constituting the semiconductor layered bodies can be grown, but bonding substrates that are bonded to the semiconductor element structures from which the crystal growth substrates have been removed may be employed.

The first element substrate 24A, the second element substrate 24B, and the third element substrate 24C are preferably light-transmissive. This structure allows for obtaining the light-emitting device 100 in which flip-chip mounting is easily employed and light extraction efficiency of the light-emitting device 100 can be easily increased.

Examples of base materials of the first element substrate 24A, the second element substrate 24B, and the third element substrate 24C include sapphire, gallium nitride, aluminum nitride, silicon, silicon carbide, gallium arsenide, gallium phosphide, indium phosphide, zinc sulfide, zinc oxide, zinc selenide, and diamond. Sapphire is particularly preferably used.

The first element substrate 24A, the second element substrate 24B, and the third element substrate 24C can have any appropriately thickness and preferably have a thickness in a range of, for example, 0.02 mm to 1 mm, more preferably 0.05 mm to 0.3 mm, in view of the strength and/or the thickness of the light-emitting device 100.

While an example of the light-emitting device 100 including the three light-emitting elements including the first light-emitting element 20A, the second light-emitting element 20B, and the third light-emitting element 20C is described in the first embodiment, the light-emitting device 10 may include any appropriate number of light-emitting elements, as long as the number of light-emitting elements is two or more. For example, as in a light-emitting device 100A according to a first modified example described below, the light-emitting device may include two light-emitting elements including the first light-emitting element 20A and the second light-emitting element 20B (see FIG. 3).

The first light-emitting element 20A, the second light-emitting element 20B, and the third light-emitting element 20C are semiconductor elements that emit light when voltage is applied, and known semiconductor elements including nitride semiconductors or the like can be used for the first light-emitting element 20A, the second light-emitting element 20B, and the third light-emitting element 20C. Examples of the first light-emitting element 20A, the second light-emitting element 20B, and the third light-emitting element 20C include LED chips.

A nitride semiconductor, which can efficiently excite a wavelength conversion member and can emit light with a short wavelength, is preferably used as a semiconductor material employed for the semiconductor elements. The nitride semiconductor is mainly represented by the general formula $In_xAl_yGa_{1-x-y}N$ (where $0 \le x$, $0 \le y$, and $x+y \le 1$). Other examples of the semiconductor material include InAlGaAs semiconductors, InAlGaP semiconductors, zinc sulfide, zinc selenide, and silicon carbide.

The peak emission wavelength of the first light-emitting element 20A is preferably 430 nm or greater and less than 490 nm (blue wavelength range).

The peak emission wavelength of the second light-emitting element 20B preferably differs from the peak emission wavelength of the first light-emitting element 20A, and is preferably 490 nm or greater and less than 570 nm (i.e., green wavelength range). The half band width of the second light-emitting element 20B is preferably 5 nm or greater and 40 nm or less. With the half band width of the second light-emitting element 20B of 5 nm or greater, the light output of the second light-emitting element 20B can be improved. With the half-width of the second light-emitting element 20B of 40 nm or less, green light having a sharp emission peak can be emitted.

The peak emission wavelength of the third light-emitting element 20C is preferably equal to the peak emission wavelength of the first light-emitting element 20A and different from the peak emission wavelength of the second light-emitting element 20B. The peak emission wavelength of the third light-emitting element 20C is preferably 430 nm or greater and less than 490 nm (i.e., blue wavelength range). The expression "equal to the peak emission wavelength" in the present specification includes deviation of about ±10 nm.

With the peak emission wavelength of the first light-emitting element 20A, the peak emission wavelength of the second light-emitting element 20B, and the peak emission wavelength of the third light-emitting element 20C as described above, the color reproducibility of the light-emitting device 100 can be improved. With the arrangement of the first light-emitting element 20A, the second light-emitting element 20B, and the third light-emitting element 20C in this order, unevenness in emission color of the light-emitting device 100 can be reduced compared with the case where the first light-emitting element 20A, the third light-emitting element 20C, and the second light-emitting element 20B are arranged in this order.

The peak emission wavelength of the first light-emitting element 20A may be 490 nm or greater and less than 570 nm (i.e., green wavelength range), the peak emission wavelength of the second light-emitting element 20B may be 430 nm or greater and less than 490 nm (i.e., blue wavelength range), and the peak emission wavelength of the third light-emitting element 20C may be 490 nm or greater and less than 570 nm (i.e., green wavelength range). That is, while the peak emission wavelength of the first light-emitting element 20A, the peak emission wavelength of the second light-emitting element 20B, and the peak emission wavelength of the third light-emitting element 20C can be selected from the ultraviolet range to the infrared range by selecting semiconductor materials and mixed crystal ratios of the semiconductor materials, it is preferable that the peak emission wavelength of the first light-emitting element 20A is equal to the peak emission wavelength of the third light-emitting element 20C, the peak emission wavelength of the second light-emitting element 20B differs from the peak emission wavelength of the first light-emitting element 20A, and the peak emission wavelength of the third light-emitting element 20C.

The light-transmissive member 30 covers the first element light extracting surface 201A and the second element light extracting surface 201B such that a portion of the light-guide member 60 is located between the light-transmissive member 30 and each of the first element light extracting surface 201A and the second element light extracting surface 201B. In the case where the light-emitting device includes the third light-emitting element 20C, the light-transmissive member 30 covers the first element light extracting surface 201A, the second element light extracting surface 201B, and the third element light extracting surface 201C such that a portion of the light-guide member 60 is located between the light-transmissive member 30 and each of the first element light extracting surface 201A, the second element light extracting surface 201B, and the third element light extracting surface 201C.

The light-transmissive member 30 may include a first light-transmissive layer 31A facing the first element light extracting surface 201A, the second element light extracting surface 201B, and the third element light extracting surface 201C, a wavelength conversion layer 31B disposed on the first light-transmissive layer 31A, and a second light-transmissive layer 31C disposed on the wavelength conversion layer 31B. The first light-transmissive layer 31A, the wavelength conversion layer 31B, and the second light-transmissive layer 31C are layered.

The wavelength conversion layer 31B of the light-transmissive member 30 may be a single layer or may have a layered structure including a plurality of layers containing different phosphors. For example, the light-transmissive member 30 may include a first wavelength conversion layer 311B and a second wavelength conversion layer 312B covering the first wavelength conversion layer 311B, as in a light-emitting device 100 shown in FIG. 2B.

The second wavelength conversion layer 312B may directly cover the first wavelength conversion layer 311B or may cover the first wavelength conversion layer 311B such that another layer such as a light-transmissive layer (such as a layer 31D shown in FIG. 2B) is disposed between the second wavelength conversion layer 312B and the first wavelength conversion layer 311B. The first wavelength conversion layer 311B is disposed more closely to the upper surface of the first light-emitting element 20A, the upper surface of the second light-emitting element 20B, and the upper surface of the third light-emitting element 20C than the second wavelength conversion layer 312B is. The peak emission wavelength of a wavelength conversion material contained in the first wavelength conversion layer 311B is preferably shorter than the peak emission wavelength of a wavelength conversion material contained in the second wavelength conversion layer 312B. With this structure, light emitted from the first wavelength conversion layer 311B excited by the first light-emitting element, the second light-emitting element, and the third light-emitting element can excite the wavelength conversion material in the second wavelength conversion layer 312B. Thus, light emitted from the wavelength conversion material in the second wavelength conversion layer 312B can be increased.

For example, the peak emission wavelength of the wavelength conversion material contained in the first wavelength conversion layer 311B is preferably 500 nm or greater and 570 nm or less, and the peak emission wavelength of the wavelength conversion material contained in the second wavelength conversion layer 312B is preferably 610 nm or greater and 750 nm or less. With this constitution, the light-emitting device can have high color reproducibility. Examples of the wavelength conversion material contained in the first wavelength conversion layer 311B include β-SiAlON phosphors, and examples of the wavelength conversion material contained in the second wavelength conversion layer 312B include manganese-activated potassium fluorosilicate phosphors. In the case where a manganese-activated potassium fluorosilicate phosphor is used for the wavelength conversion material contained in the second wavelength conversion layer 312B, it is particularly preferable that the light-transmissive member 30 include the first wavelength conversion layer 311B and the second wavelength conversion layer 312B. A manganese-activated potassium fluorosilicate phosphor easily reaches luminance saturation, but the arrangement in which the first wavelength conversion layer 311B is located between the second wavelength conversion layer 312B and the light-emitting elements allows for preventing the manganese-activated potassium fluorosilicate phosphor from being excessively irradiated with light emitted from the light-emitting elements. Accordingly, deterioration of the manganese-activated potassium fluorosilicate phosphor can be reduced.

In the case of using a β-SiAlON phosphor for the wavelength conversion material contained in the first wavelength conversion layer 311B and using a manganese-activated potassium fluorosilicate phosphor for the wavelength conversion material contained in the second wavelength conversion layer 312B, the weight of the manganese-activated potassium fluorosilicate phosphor may be heavier than the weight of the β-SiAlON phosphor. For example, the weight of the manganese-activated potassium fluorosilicate phosphor may be 1.5 times to 30 times the weight of the β-SiAlON phosphor.

For base materials of the first light-transmissive layer 31A, the wavelength conversion layer 31B, and the second light-transmissive layer 31C, the same resin material is preferably used. If the base material of the first light-transmissive layer 31A and the base material of the wavelength conversion layer 31B are the same resin material, the difference in refractive index between the first light-transmissive layer 31A and the wavelength conversion layer 31B can be reduced. This structure allows for reducing reflection of light emitted from each light-emitting element at the interface between the first light-transmissive layer 31A and the wavelength conversion layer 31B, so that light extraction efficiency of the light-emitting device can be increased. Further, using the same resin material for the base material of the wavelength conversion layer 31B and for the base material of the second light-transmissive layer 31C allows for increasing light extraction efficiency of the light-emitting device. The expression "the same resin material" as used in the present specification refers to the same type of resin material. For example, using a silicone resin for the base material of the first light-transmissive layer 31A, for the base material of the wavelength conversion layer 31B, and for the base material of the second light-transmissive layer 31C can be regarded as using the same resin material for the first light-transmissive layer 31A, the wavelength conversion layer 31B, and the second light-transmissive layer 31C.

The base material of the light-transmissive member 30 is a material transmissive to light emitted from the first light-emitting element 20A, the second light-emitting element 20B, and the third light-emitting element 20C. In the present specification, the term "transmissive" refers to having transmittance to light at the peak emission wavelength of each light-emitting element is preferably 60% or more, more preferably 70% or more, even more preferably 80% or more.

Examples of the base material of the light-transmissive member 30 include a silicone resin, an epoxy resin, a phenolic resin, a polycarbonate resin, an acrylic resin, a modified resin of these resins, and glass. A silicone resin or a modified silicone resin has high resistance to heat and light, and thus is particularly preferably used for the base material of the light-transmissive member 30. More specific examples of the silicone resins include dimethyl silicone resins, phenyl-methyl silicone resins, and diphenyl silicone resins. The term "modified resin" in the present specification includes hybrid resin.

The first light-transmissive layer 31A preferably contains the base material and first diffusing particles. With the light-transmissive member 30 including the first light-transmissive layer 31A containing the first diffusing particles, the first light-transmissive layer 31A can easily diffuse light emitted from the first light-emitting element 20A, light emitted from the second light-emitting element 20B, and light emitted from the third light-emitting element 20C. Accordingly, unevenness in emission color of the light-emitting device 100 can be reduced.

The second light-transmissive layer 31C preferably contains the base material and second diffusing particles. The light-transmissive member 30 including the second light-transmissive layer 31C containing the second diffusing particles allows for efficiently mixing light emitted from the first light-emitting element 20A, light emitted from the second light-emitting element 20B, and light emitted from the third light-emitting element 20C can be efficiently mixed with light emitted from the wavelength conversion materials excited by light emitted from the first light-emitting element 20A, the second light-emitting element 20B, and the third light-emitting element 20C in the second light-transmissive layer 31C. Accordingly, unevenness in emission color of the light-emitting device 100 can be thus reduced.

The second light-transmissive layer 31C also functions as a protective layer for the wavelength conversion layer 31B. This structure allows for reducing deterioration of the wavelength conversion layer 31B even in the case where the wavelength conversion layer 31B contains a wavelength conversion material vulnerable to water (such as a manganese-activated fluoride phosphor).

For example, titanium oxide, silicon oxide, aluminum oxide, zirconium oxide, or zinc oxide can be used for the first diffusing particles and/or the second diffusing particles.

The first diffusing particles and the second diffusing particles may be made of the same material or different materials. The second diffusing particles are preferably made of a material with a refractive index lower than a refractive index of the material of the first diffusing particles. For example, titanium oxide can be selected to be used for the first diffusing particles, and silicon oxide can be selected to be used for the second diffusing particles. Light diffused by the second diffusing particles is thus reduced, and the light extraction efficiency of the light-emitting device 100 can be increased.

The wavelength conversion layer 31B preferably contains the base material and the wavelength conversion material. The wavelength conversion material absorbs at least a part of light (i.e., primary light) emitted from the first light-emitting element 20A, light (i.e., primary light) emitted from the second light-emitting element 20B, and/or light (i.e., primary light) emitted from the third light-emitting element 20C to emit secondary light having a wavelength different from a wavelength of the primary light. For the wavelength conversion material, among specific examples of materials described below, one material can be used singly, or two or more materials can be used in combination.

Examples of a wavelength conversion material that emit green light include yttrium-aluminum-garnet based phosphors (for example, $Y_3(Al,Ga)_5O_{12}:Ce$), lutetium-aluminum-garnet based phosphors (for example, $Lu_3(Al,Ga)_5O_{12}:Ce$), terbium-aluminum-garnet based phosphors (for example, $Tb_3(Al,Ga)_5O_{12}:Ce$), silicate based phosphors (for example, $(Ba,Sr)_2SiO_4:Eu$), chlorosilicate based phosphors (for example, $Ca_8Mg(SiO_4)_4Cl_2:Eu$), β-SiAlON based phosphors (for example, $Si_{6-z}Al_zO_zN_{8-z}:Eu$ ($0<z<4.2$)), SGS based phosphors (for example, $SrGa_2S_4:Eu$), and alkaline earth aluminate based phosphors $(Ba,Sr,Ca)Mg_xAl_{10}O_{16+x}$: Eu, Mn (where $0 \leq x \leq 1$).

Examples of a wavelength conversion material that emit yellow light include α-SiAlON based phosphors (for example, $M_z(Si,Al)_{12}(O,N)_{16}$ (where $0<z\leq2$, and M is Li, Mg, Ca, Y, or a lanthanoid element except for La and Ce)). The examples of the wavelength conversion material that emit green light, which are described above, include wavelength conversion materials that also emit yellow light. Also, for example, substituting a part of Y in an yttrium-aluminum-garnet based phosphor with Gd allows for shifting a peak emission wavelength of the yttrium-aluminum-garnet based phosphor to a longer wavelength side, so that yellow emission can be obtained. The examples of wavelength conversion materials described above include wavelength conversion materials that can also emit orange light.

Examples of a wavelength conversion material that emit red light include nitrogen-containing calcium aluminosilicate (CASN or SCASN) based phosphors (for example, $(Sr,Ca)AlSiN_3:Eu$). The examples of the wavelength conversion material that emit red light also include manganese-activated fluoride based phosphors (phosphors represented by the general formula (I) $A_2[M_{1-a}Mn_aF_6]$ (in the general formula (I), the symbol "A" is at least one selected from the group consisting of K, Li, Na, Rb, Cs, and $NH_4$, M is at least one element selected from the group consisting of the Group IV elements and the Group XIV elements, and the symbol "a" satisfies $0<a<0.2$)). More specific examples of the manganese-activated fluoride-based phosphors include manganese-activated potassium fluorosilicate phosphors (for example, $K_2SiF_6:Mn$).

For example, when including the first light-emitting element 20A having the peak emission wavelength of 430 nm or greater and less than 490 nm (i.e., blue wavelength range), the second light-emitting element 20B having the peak emission wavelength of 490 nm or greater and less than 570 nm (i.e., green wavelength range), and the third light-emitting element 20C having the peak emission wavelength of 430 nm or greater and less than 490 nm (i.e., blue wavelength range), the peak emission wavelength of the wavelength conversion material is preferably 580 nm or greater and less than 680 nm (i.e., red wavelength range). This constitution allows for improving the color reproducibility of light emitted from the light-emitting device 100.

The wavelength conversion layer 31B may further contain diffusing particles. With the light-transmissive member 30 including the wavelength conversion layer 31B containing the diffusing particles, diffusion of light emitted from each light-emitting element and/or light emitted from the wavelength conversion material excited by light emitted from each light-emitting element can be facilitated, so that the amount of the wavelength conversion material to be used can be reduced. The particle diameter of the diffusing particles is, for example, preferably in a range of approximately 0.1 µm to 3 µm.

The light-transmissive member 30 may include a third light-transmissive layer that contains substantially no wavelength conversion material and/or substantially no diffusing particles between the first light-transmissive layer 31A and the wavelength conversion layer 31B. With the third light-transmissive layer is located between the first light-transmissive layer 31A and the wavelength conversion layer 31B, detachment between the first light-transmissive layer 31A and the wavelength conversion layer 31B can be prevented. With substantially no wavelength conversion material and/or substantially no diffusing particles, the third light-transmissive layer can be a layer with high adhesive strength. The expression "contains substantially no wavelength conversion material and/or substantially no diffusing particles" as used herein refers to that a wavelength conversion material and/or diffusing particles that are unavoidably contained may be contained, and the content of each of the wavelength conversion material and the diffusing member in the third light-transmissive layer is preferably 0.05 wt % or less. The light-transmissive member 30 may include the third light-transmissive layer between the wavelength conversion layer 31B and the second light-transmissive layer 31C. With the third light-transmissive layer located between the wavelength conversion layer 31B and the second light-transmissive layer 31C, detachment between the wavelength conversion layer 31B and the second light-transmissive layer 31C can be prevented.

The first reflective member 40 is disposed to surround the first light-emitting element 20A, the second light-emitting element 20B, the third light-emitting element 20C, and the light-guide member 60 in a top view (see FIG. 1C).

The first reflective member 40 can reflect light traveling in the X direction and/or the Y direction from the first light-emitting element 20A to the third light-emitting element 20C, to increase light traveling in the Z direction.

The first reflective member 40 preferably covers the lateral surfaces of the first light-transmissive layer 31A, the lateral surfaces of the wavelength conversion layer 31B, and the lateral surfaces of the second light-transmissive layer 31C. This structure allows for realizing the light-emitting device 100 with which high contrast between a light-emitting region and a non-light-emitting region and good visibility can be obtained.

The light reflectance of the first reflective member 40 at the peak emission wavelength of each light-emitting element is preferably 70% or more, more preferably 80% or more, even more preferably 90% or more, in view of the light extraction efficiency in the Z direction. The first reflective member 40 can be formed by using, for example, transfer molding technique, injection molding technique, compression molding technique, potting technique, or printing.

For a base material of the first reflective member 40, a resin such as a silicone resin, an epoxy resin, a phenolic resin, a polycarbonate resin, an acrylic resin, or a modified resin of these resins is preferably used. A silicone resin and a modified silicone resin have good heat and light resistance, and thus are particularly preferably used. Examples of the silicone resins include dimethyl silicone resins, phenyl-methyl silicone resins, and diphenyl silicone resins.

The first reflective member 40 is preferably white, and preferably contains a white pigment in the base material of the first reflective member 40. Examples of the white pigment include titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, and silicon oxide, which can be used singly or in a combination of two or more.

The shape of the white pigment can be appropriately selected.
The white pigment may have irregular shapes or a crushed shape, but preferably has a spherical shape in view of fluidity. The white pigment has a particle diameter of, for example, preferably about 0.1 µm to 0.5 µm. The smaller the particle diameter of the white pigment, the more preferable, to enhance effects of light reflection and covering.

The content of the white pigment can be appropriately selected, and is preferably, for example, 10 wt % to 80 wt %, more preferably 20 wt % to 70 wt %, even more preferably 30 wt % to 60 wt %, in view of light reflectivity, the viscosity in a fluid state, and the like. The term "wt %" refers to percentage by weight, which is the proportion of the weight of a material of interest to the total weight of the first reflective member 40.

The outer lateral surface of the first reflective member 40 on the mounting surface (back surface 113 described below) facing the mounting substrate is preferably inclined toward the center of the light-emitting device 100 in the +Z direction. This structure allows for reducing contact between the lateral surface of the first reflective member 40 and the mounting substrate when the light-emitting device 100 is mounted on the mounting substrate, which can facilitate stable mounting orientation of the light-emitting device 100. The +Z direction on a Z axis refers to a direction extending from a bottom surface 112 of a support substrate 11 described below toward an upper surface 111 of the support substrate 11, and the direction opposite to the +Z direction is the −Z direction. The outer lateral surface of the first reflective member 40 on the surface (i.e., front surface 114 described below) opposite to the mounting surface is preferably inclined toward the center of the light-emitting device 100 in the +Z direction. This structure allows for reducing contact between the lateral surface of the first reflective member 40 and a suction nozzle (i.e., collet), so that damage to the first reflective member 40 at the time of suction of the light-emitting device 100 can be reduced.

An inclination angle of the first reflective member 40 can be appropriately selected, and is preferably in a range of 0.3° to 3°, more preferably 0.5° to 2°, even more preferably 0.7° to 1.5°.
When the light-emitting device 100 including the first reflective member 40 with the inclined outer lateral surface is connected to the mounting substrate, the orientation of the light-emitting device 100 to irradiate light is adjusted.

One of the inclined members 50 (more specifically, first inclined member 50A) is disposed between the first light-emitting element 20A and the first reflective member 40 in the longitudinal direction in contact with the first reflective member 40. The inclined member 50 (more specifically, first inclined member 50A) has an inclined surface inclined relative to the light-transmissive member 30. In addition, the inclined member 50 (more specifically, first inclined member 50A) is spaced apart from the light-transmissive member 30.

Similarly, one of the inclined members 50 (more specifically, third inclined member 50C) is disposed between the third light-emitting element 20C and the first reflective member 40 in the longitudinal direction in contact with the first reflective member 40, and has an inclined surface inclined with respect to the light-transmissive member 30. In addition, the inclined member 50 (more specifically, third inclined member 50C) is spaced apart from the light-transmissive member 30.

The inclined member 50 (more specifically, first inclined member 50A) preferably has a convex inclined surface protruding toward the first light-emitting element 20A. With the inclined member 50 having the convex inclined surface protruding toward the first light-emitting element 20A, the light extraction efficiency of the first light-emitting element 20A, the second light-emitting element, and/or the third light-emitting element 20C can be inclined. Similarly, the inclined member 50 (i.e., third inclined member 50C) preferably has a convex inclined surface protruding toward the third light-emitting element 20C.

The highest portion of an upper end of the inclined member 50 (more specifically, first inclined member 50A) is preferably located between the first element light extracting surface 201A and the first element electrode formation surface 203A in the Z direction. With the highest portion of the upper end of the inclined member 50 (more specifically, first inclined member 50A) located lower than the first element light extracting surface 201A, the distance between the upper end of the inclined member 50 (more specifically, first inclined member 50A) and the lower surface of the light-transmissive member 30 in the Z direction is longer than in the case where the uppermost portion of the upper end of the inclined member 50 (more specifically, first inclined member 50A) is located higher than the first element light extracting surface 201A. Increase of the distance between the upper end of the inclined member 50 (more specifically, first inclined member 50A) and the lower surface of the light-transmissive member 30 in the Z direction allows for increasing the volume of a portion of the light-guide member 60 located between the upper end of the inclined member 50 (more specifically, first inclined member 50A) and the lower surface of the light-transmissive member 30. This structure allows for facilitating propagation of light emitted from each light-emitting element into the light-guide member 60 located between the upper end of the inclined member 50 (more specifically, first inclined member 50A) and the lower surface of the light-transmissive member 30. Accordingly, with the upper end of the inclined member 50 (more specifically, first inclined member 50A) located lower than the first element light extracting surface 201A in the Z direction, the color mixing performance of the light-emitting device can be improved.

In the case where the uppermost portion of the upper end of the inclined member 50 (first inclined member 50A) is located higher than the first element electrode formation surface 203A in the Z direction, the inclined surface of the inclined member 50 allows for increasing the light extraction efficiency of each light-emitting element.

Similarly, the highest portion of the upper end of the inclined member 50 (third inclined member 50C) is preferably located between the third element light extracting surface 201C and the third element electrode formation surface 203C. This structure allows for improving the color mixing performance and/or the light extraction efficiency of the light-emitting device.

The inclined members 50 are preferably arranged such that the inclined members 50 do not overlap with the first light-emitting element 20A and/or the second light-emitting element 20B in the Y direction. With this structure, a thickness of the light-emitting device 100 can be reduced in the Y direction. The inclined member 50 preferably has a rectangular shape in a top view.

In a top view, the inclined member 50 particularly preferably has a rectangular shape having short sides in the X direction and long sides in the Y direction. With this structure, the light-emitting device 100 can be miniaturized in the X direction.

The inclined member 50 preferably has a reflectance at the peak emission wavelength of each light-emitting element of 70% or more, more preferably 80% or more, even more preferably 90% or more, in view of the light extraction efficiency in the Z direction.

The inclined members 50 can be formed using, for example, a transfer molding technique, injection molding technique, compression molding technique, or potting technique.

A resin same as the resin used for the first reflective member 40 can be used for the base material of the inclined members 50. The inclined members 50 may contain a known white pigment such as titanium oxide or silicon oxide. This structure allows for facilitating reflection of light, emitted from the light-emitting elements, by the inclined member, so that the light extraction efficiency of the light-emitting device can be increased. The inclined member 50 may be made of a material same as and white pigment of a content same as those of the first reflective member 40.

The light-guide member 60 covers the first element light extracting surface 201A, the first element lateral surfaces 202A, the second element light extracting surface 201B, the second element lateral surfaces 202B, the third element light extracting surface 201C, and the third element lateral surfaces 202C. Further, the light-guide member 60 bonds the first light-emitting element 20A, the second light-emitting element 20B, and the third light-emitting element 20C to the light-transmissive member 30 and guides light emitted from each light-emitting element to the light-transmissive member 30. With this structure, light emitted from respective light-emitting elements can be mixed together within the light-guide member 60, so that the unevenness in emission color of the light-emitting device 100 can be reduced.

The light-guide member 60 preferably contains a wavelength conversion material (second wavelength conversion material) in the base material.

The second wavelength conversion material absorbs at least a portion of light (primary light) emitted from the first light-emitting element 20A, a portion of light (primary light) emitted from the second light-emitting element 20B, and a portion of light (primary light) emitted from the third light-emitting element 20C, and emit secondary light having a wavelength different from a wavelength of the primary light. For example, one of the materials described above for the wavelength conversion material used in the wavelength conversion layer 31B can be used singly, or two or more of the materials can be used in combination for the second wavelength conversion material.

A resin same as the resin used for the first reflective member 40 can be used for the base material of the light-guide member 60.

The peak emission wavelength of the second wavelength conversion material is preferably 580 nm or greater and less than 680 nm. The peak emission wavelength of the second wavelength conversion material is preferably 515 nm or greater and less than 550 nm. In the case where two or more types of wavelength conversion materials are used for the second wavelength conversion material, it is preferable to use a wavelength conversion material with a peak emission wavelength of 580 nm or greater and less than 680 nm and a wavelength conversion material with a peak emission wavelength of 515 nm or greater and less than 550 nm. This constitution allows for facilitating adjustment of emission color of the light-emitting device.

The concentration of the second wavelength conversion material is preferably higher at an inclined surface side of one of the inclined members 50 (more specifically, first inclined member 50A) than between the first light-emitting element 20A and the second light-emitting element 20B and is preferably higher at the inclined surface side of the other of the inclined members 50 (more specifically, third inclined member 50C) than between the second light-emitting element 20B and the third light-emitting element 20C. With this structure, for example, in the case where the second light-emitting element emits green light, even if light emitted from the second light-emitting element is not extracted, green light can be extracted by using the first light-emitting element and the second wavelength conversion material. For example, the concentration of the second wavelength conversion material at the inclined surface side of the inclined member 50 (more specifically, first inclined member 50A) may be 1.5 times or more the concentration of the second wavelength conversion material between the first light-emitting element 20A and the second light-emitting element 20B.

Each of the plurality of first element electrodes 21A and 22A, which are disposed on the first light-emitting element 20A, and a corresponding one of the first wirings 12 are electrically connected via a corresponding one of electrically-conductive adhesive members 70. Similarly, each of the plurality of second element electrodes 21B and 22B, which are disposed on the second light-emitting element 20B, and a corresponding one of the first wirings 12 are electrically connected via a corresponding one of the electrically-conductive adhesive members 70. Similarly, each of the plurality of third element electrodes 21C and 22C, which are disposed on the third light-emitting element 20C, and a corresponding one of the first wirings 12 are electrically connected via a corresponding one of electrically-conductive adhesive members 70.

For the material of the electrically-conductive adhesive members 70, any one of: a bump of gold, silver, or copper; a metal paste containing a resin binder and powder of a metal such as silver, gold, copper, platinum, aluminum, or palladium; a solder such as a tin-bismuth solder, a tin-copper solder, a tin-silver solder, or a gold-tin solder; and a brazing material such as a low-melting-point metal is preferably used.

A substrate 10 includes the support substrate 11, the first wirings 12 (each including a base wiring portion 12A and a connecting wiring portion 12B), second wirings 13 (each including a base wiring portion 13A and a connecting wiring portion 13B), and vias 15 (each including a fourth wiring 151 and a filler member 152). The support substrate 11 may define one or more recesses 16, and when the support substrate 11 defines the recesses 16, (for example, central recesses 16A and peripheral recesses 16B), the substrate 10 may include third wirings 14 each covering a respective one of inner walls defining a respective one of the recesses 16.

The support substrate 11 has the upper surface 111 extending in the longitudinal direction (X direction shown in FIG. 2C) and the width direction (Y direction shown in FIG. 2C), the bottom surface 112 opposite to the upper surface 111, the back surface 113 adjacent and perpendicular to the upper surface 111, and a front surface 114 opposite to the back surface 113. The support substrate 11 further has lateral surfaces between the upper surface 111 and the bottom surface 112.

The support substrate 11 is particularly preferably made of a material having a linear expansion coefficient similar to a linear expansion coefficient of the first light-emitting element 20A, the second light-emitting element 20B, and the third light-emitting element 20C.

Examples of the material for the support substrate 11 include insulating materials such as resins or fiber-reinforced resins, ceramics, and glass. Examples of the resins or fiber-reinforced resins include epoxy resins, glass epoxy resins, bismaleimide-triazine (BT) resins, and polyimides.

Examples of the ceramics include aluminum oxide, aluminum nitride, zirconium oxide, zirconium nitride, titanium oxide, titanium nitride, and mixtures of these.

The lower limit of a thickness of the support substrate 11 is preferably 0.05 mm or more, more preferably 0.2 mm or more, in view of the strength.

The upper limit of a thickness of the support substrate 11 is preferably 0.5 mm or less, more preferably 0.4 mm or less, in view of the thickness (depth) of the light-emitting device 100 in the Z direction.

Each first wiring 12 includes the base wiring portion 12A and the connecting wiring portion 12B, and is disposed on the upper surface 111 of the support substrate 11. Each of the first wirings 12 is electrically connected to corresponding one or more of the first light-emitting element 20A, the second light-emitting element 20B, and the third light-emitting element 20C. Each first wiring 12 includes the base wiring portion 12A electrically connected to the second wiring 13, and includes the connecting wiring portion 12B facing the base wiring portion 12A, covering the filler members 152 at an upper ends of the filler members 152, and electrically connected to a corresponding one of the first element electrodes 21A and 22A, the second element electrodes 21B and 22B, and the third element electrodes 21C and 22C.

Each of the first wirings 12 preferably includes one or more projections 121 at positions each overlapping with a corresponding one of the first element electrodes 21A and 22A of the first light-emitting element 20A, a corresponding one of the second element electrodes 21B and 22B of the second light-emitting element 20B, or a corresponding one of the third element electrodes 21C and 22C of the third light-emitting element 20C in a top view. With this structure, alignment of each light-emitting element with respect to the substrate 10 can be easily performed due to the self-alignment effect when connecting corresponding ones of the first wirings 12 to the first element electrodes 21A and 22A, connecting corresponding ones of the first wirings 12 to the second element electrodes 21B and 22B, and connecting corresponding ones of the first wiring 12 to the third element electrodes 21C and 22C, using the electrically-conductive adhesive members 70.

The projections 121 may have any appropriate shape, height, size, and the like of, and are preferably adjusted appropriately according to the size of the substrate 10, the thickness of the first wiring 12, the size of the first light-emitting element 20A, the size of the second light-emitting element 20B, the size of the third light-emitting element 20C, or the like.

The lateral surfaces of the projections 121 may be inclined or perpendicular with respect to an upper surface of the base wiring portion 12A. If the lateral surfaces are perpendicular to the upper surface of the base wiring portion 12A, the first light-emitting element 20A, the second light-emitting element 20B, and the third light-emitting element 20C, which are to be placed above the projections 121, can be easily secured, and each light-emitting element can be stably mounted. The term "perpendicular" in the present specification may include inclination of about ±3°.

The second wirings 13 are disposed on the bottom surface 112 of the support substrate 11, and each of the second wirings 13 is electrically connected to a respective one of the first wirings 12 through the vias 15. Each second wiring 13 includes the base wiring portion 13A electrically connected to the first wiring 12 and includes the connecting wiring portion 13B that faces the base wiring portion 13A, covers the filler members 152 at lower ends of the filler members 152, and is electrically connected to the fourth wiring 151.

Each second wiring 13 may be provided with an insulating film 18 covering a portion of the second wiring 13. The insulating film 18 is preferably made of a material used in the field of the invention, such as a thermosetting resin and a thermoplastic resin. With the second wirings 13 each provided with the insulating film 18, the insulation at the bottom surface 112 can be more surely provided, and short circuits can be more surely prevented. Further, with the second wirings 13 each provided with the insulating film 18, detachment of the second wiring 13 from the support substrate 11 can be prevented.

The first wirings 12, the second wirings 13, and the third wirings 14 are preferably made of, for example, copper, iron, nickel, tungsten, chromium, aluminum, silver, gold, titanium, palladium, rhodium, or an alloy of one or more of these metals. A single layer or multilayer of these metals or alloys of one or more of these metals may be used for the first wirings 12, the second wirings 13, and the third wirings 14. The first wiring 12, the second wiring 13, and the third wiring 14 are preferably made of copper or a copper alloy in view of the heat dissipation performance. For example, a layer of silver, platinum, aluminum, rhodium, gold, or an alloy of one or more of these metals is preferably disposed at a surface of each of the first wiring 12, the second wiring 13, and the third wiring 14, in view of wettability of the electrically-conductive adhesive members 70 and/or light reflectivity.

The vias 15 are disposed in through-holes bored through the upper surface 111 of the support substrate 11 and the bottom surface 112 of the support substrate 11 and electrically connect the first wiring 12 to the second wiring 13. The vias 15 each include a tubular portion of the fourth wiring 151 disposed on the inner circumferential surface of the through-hole formed in the Z direction and the filler member 152 disposed inside the fourth wiring 151.

Each via 15 is preferably in contact with a corresponding first wiring 12, a corresponding second wiring 13, and a corresponding third wiring 14. With this structure, heat generated from each light-emitting element can be transmitted to the second wiring 13 and/or the third wiring 14 through the first wiring 12 and the via 15, so that the heat dissipation performance of the light-emitting device 100 can be improved. The substrate 10 may not have the vias 15.

The fourth wirings 151 are preferably made of an electrically-conductive material substantially the same as the material of the first wiring 12, the second wiring 13, and the third wiring 14. Examples of the material of the fourth wirings 151 include copper, iron, nickel, tungsten, chromium, aluminum, silver, gold, titanium, palladium, rhodium, or alloys of one or more of these metals.

The filler members 152 may have a length in the Z direction greater than the thickness of the substrate 10 in the Z direction. For example, the filler members 152 may be made of a known electrically-conductive material such as copper or an insulating material such as an epoxy resin.

The recesses 16 formed in the substrate 10 include the central recesses 16A, which are open at the bottom surface 112 and the back surface 113, and the peripheral recesses 16B, which are open at the bottom surface 112, the back surface 113, and lateral surfaces of the substrate 10.

Figure 1D:
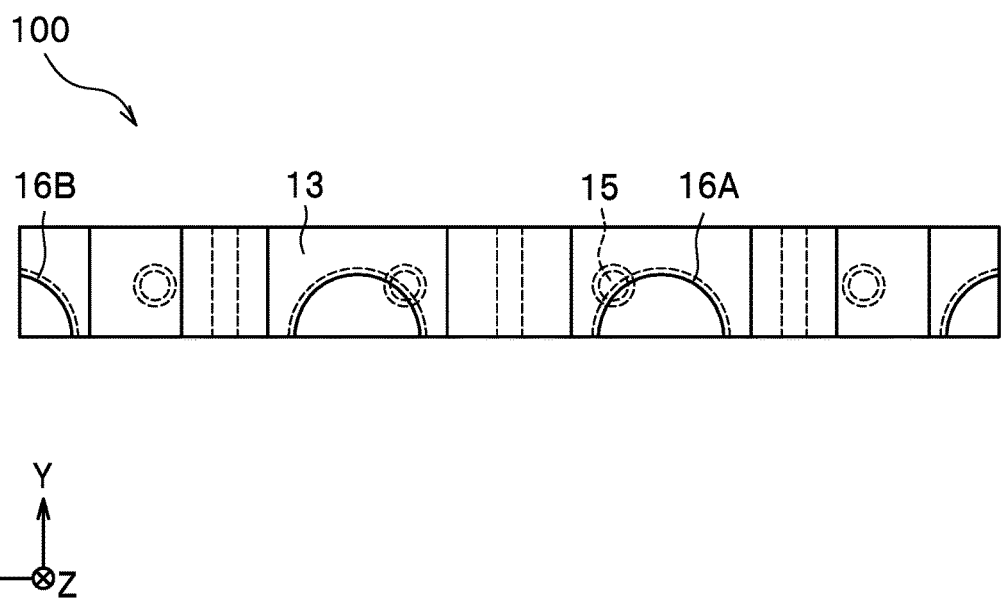
FIG. 1D is a schematic bottom view of the light-emitting device according to the first embodiment of the present disclosure.

In the recesses 16, it is preferable that, on the bottom surface 112, each of the central recesses 16A has an opening with a substantially semicircular shape, and each of the peripheral recesses 16B has an opening with a substantially quarter-circular shape (see FIG. 1D). With the openings of the recesses 16 at the bottom surface 112 having shapes without corners, concentration of stress at the recesses 16 can be reduced, and thus breakage of the support substrate 11 can be prevented.

The maximum depth of the recesses 16 in the Z direction is preferably 0.4 times to 0.9 times as large as the thickness of the substrate 10. With the maximum depth of the recesses 16 larger than 0.4 times the thickness of the substrate 10, the volumes of bonding members formed inside the recesses 16 can be increased, which allows for increasing the bonding strength between the light-emitting device 100 and the mounting substrate. With the maximum depth of the recesses 16 smaller than 0.9 times the thickness of the substrate 10, decrease in the strength of the substrate 10 can be reduced.

Each of the recesses 16 may have a depth at the front surface 114 and a depth at the back surface 113 such that the depth at the front surface 114 and the depth at the back surface 113 are the same or different from each other. For example, in the case where each of the recesses 16 has a depth greater at the back surface 113 than a depth thereof at the front surface 114 in the Z direction, the thickness of the support substrate 11 can be greater at the front surface 114 than at the back surface 113. Alternatively, for example, in the case where each of the recesses 16 has a depth greater at the front surface 114 than a depth thereof at the back surface 113 in the Z direction, the thickness of the support substrate 11 can be greater at the back surface 113 than at the front surface 114.

The substrate 10 may not have the recesses 16, but the substrate 10 with the recesses 16 can facilitate securing of the light-emitting device 100 to the mounting substrate via bonding members, such as solder, disposed in the recesses 16, so that the bonding strength between the light-emitting device 100 and the mounting substrate can be increased.

As described above, in the light-emitting device 100 according to the first embodiment, the inclined members 50 are spaced apart from the light-transmissive member 30. With this structure, light emitted from a light-emitting element (such as a green light-emitting element) with a long peak emission wavelength can be prevented from being blocked by the inclined members 50, so that the light-emitting device 100 with improved color mixing performance can be obtained.

MODIFIED EXAMPLES

Subsequently, modified examples of the light-emitting device 100 according to the first embodiment are described referring to FIG. 3, FIG. 4, FIG. 5, and FIG. 6. In a first modified example, the light-emitting device 100A is different from the light-emitting device 100 shown in FIG. 1A to FIG. 1D and FIG. 2A to FIG. 2C in the number of light-emitting elements and in that a second reflective member is disposed. In a second modified example, a light-emitting device 100B is different from the light-emitting device 100 shown in FIG. 1A to FIG. 1D and FIG. 2A to FIG. 2C in that the light extracting surface of each of the light-emitting elements is covered with a covering member and in that the second reflective member is disposed. In a third modified example, a light-emitting device 100C is different from the light-emitting device 100 shown in FIG. 1A to FIG. 1D and FIG. 2A to FIG. 2C in that the substrate is not disposed and in that the second reflective member is disposed. In a fourth modified example, a light-emitting device 100D is different from the light-emitting device 100 shown in FIG. 1A to FIG. 1D in that heights of a plurality of light-emitting elements are varied.

First Modified Example

FIG. 3 is a schematic cross-sectional view for illustrating the structure of a modified example of the light-emitting device 100 according to the first embodiment. The light-emitting device 100A according to the first modified example is described referring to FIG. 3. In the present modified example, duplicative descriptions of the same structure as in the first embodiment described above may be omitted.

A difference between the light-emitting device 100A according to the first modified example and the light-emitting device 100 according to the first embodiment is that the light-emitting device 100A according to the first modified example includes two light-emitting elements while the light-emitting device 100 according to the first embodiment includes three light-emitting elements.

Another difference between the light-emitting device 100A according to the first modified example and the light-emitting device 100 according to the first embodiment is that the light-emitting device 100A includes not only the first reflective member 40 but also a second reflective member 80.

The light-emitting device 100A has a longitudinal direction (i.e., X direction shown in FIG. 3) and a width direction (i.e., Y direction shown in FIG. 3) perpendicular to the longitudinal direction, and includes the first light-emitting element 20A, the second light-emitting element 20B, the light-transmissive member 30, the first reflective member 40, the inclined members 50, and the light-guide member 60.

The peak emission wavelength of the first light-emitting element 20A is preferably 430 nm or greater and less than 490 nm (i.e., blue wavelength range). The peak emission wavelength of the second light-emitting element 20B preferably differs from the peak emission wavelength of the first light-emitting element 20A and is preferably 490 nm or greater and less than 570 nm (i.e., green wavelength range). The light-transmissive member 30 covers the first element light extracting surface 201A and the second element light extracting surface 201B such that a portion of the light-guide member 60 is located between the light-transmissive member 30 and each of the first element light extracting surface 201A and the second element light extracting surface 201B. The first reflective member 40 surrounds the first light-emitting element 20A, the second light-emitting element 20B, and the light-guide member 60 in a top view.

The second reflective member 80 is disposed between the first element electrode formation surface 203A and the upper surface of the substrate 10 and between the second element electrode formation surface 203B and the upper surface of the substrate 10. With the second reflective member 80 covering the first element electrode formation surface 203A and the second element electrode formation surface 203B, absorption of light emitted from the first light-emitting element 20A and the second light-emitting element 20B into the substrate 10 can be reduced. This structure allows for increasing the light extraction efficiency of the light-emitting device 100A.

A portion of an upper surface of the second reflective member 80 in contact with the first light-emitting element is preferably located between the first element light extracting surface 201A and the first element electrode formation surface 203A in the Z direction.

With the second reflective member 80 having the upper surface located above the first element electrode formation surface 203A, absorption of light, emitted from the first light-emitting element, into the first element electrodes 21A and 22A can be reduced. With the second reflective member 80 having the upper surface located below the first element light extracting surface 201A, extraction of light from the lateral surfaces of the light-emitting element can be facilitated, so that the light extraction efficiency of the light-emitting device can be improved.

The second reflective member 80 preferably includes inclined portion(s) that has a thickness gradually increased in the Z direction according to increase in the distance from the first light-emitting element 20A and/or the second light-emitting element 20B. With the second reflective member 80 including the inclined portion, extraction efficiency of light emitted from the first light-emitting element 20A and/or the second light-emitting element 20B can be increased.

The light reflectance of the second reflective member 80 at the peak emission wavelength of each light-emitting element is preferably 70% or more, more preferably 80% or more, even more preferably 90% or more, in view of the light extraction efficiency in the Z direction. The second reflective member 80 can be formed by using, for example, a transfer molding technique, an injection molding technique, a compression molding technique, or a potting technique.

The same resin as the resin used for the first reflective member 40 can be used for a base material of the second reflective member 80. Further, for the second reflective member 80, a material and a white pigment that are the same as those of the first reflective member 40 may be used. A material and a white pigment same as those of the first reflective member 40 with the same content as in the first reflective member 40 may be used for the second reflective member 80. The white pigment contained in the first reflective member 40 may be predominantly disposed at the upper surface 111 of the support substrate.

The inclined member 50 (more specifically, first inclined member 50A) is disposed between the first light-emitting element 20A and the first reflective member 40 in the longitudinal direction in contact with the first reflective member 40 and the second reflective member 80, and has an inclined surface inclined relative to the light-transmissive member 30. In addition, the inclined member 50 (more specifically, first inclined member 50A) is spaced apart from the light-transmissive member 30.

Similarly, the inclined member 50 (more specifically, second inclined member 50C) is disposed between the second light-emitting element 20B and the first reflective member 40 in the longitudinal direction in contact with the first reflective member 40 and the second reflective member 80, and has an inclined surface inclined relative to the light-transmissive member 30. In addition, the inclined member 50 (more specifically, second inclined member 50C) is spaced apart from the light-transmissive member 30.

The inclined member 50 (more specifically, second inclined member 50C) preferably has a convex inclined surface protruding toward the second light-emitting element 20B. This structure allows for improving the light extraction efficiency and the color mixing performance of the light-emitting device 100A.

The highest portion of an upper end of the inclined member 50 (second inclined member 50C) in the Z direction is preferably located between the second element light extracting surface 201B and the second element electrode formation surface 203B. This structure allows light emitted from the second light-emitting element 20B to be more easily spread than in the case where the highest portion of the upper end of the inclined member 50 (more specifically, second inclined member 50C) is located higher than the second element light extracting surface 201B in the Z direction. In other words, light emitted from a light-emitting element with a long peak emission wavelength is not easily blocked by the inclined member 50 (more specifically, second inclined member 50C), so that the light-emitting device 100A having improved color mixing performance can be obtained.

The light-guide member 60 covers the first element light extracting surface 201A, the first element lateral surfaces 202A, the second element light extracting surface 201B, and the second element lateral surfaces 202B. The light-guide member 60 also bonds the first light-emitting element 20A and the second light-emitting element 20B to the light-transmissive member 30, and guides light emitted from each light-emitting element to the light-transmissive member 30.

In the light-emitting device 100A according to the first modified example, the inclined members 50 are spaced apart from the light-transmissive member 30. With this structure, light emitted from the first light-emitting element and/or the second light-emitting element is not easily blocked by the inclined members 50, so that the light-emitting device 100A with improved color mixing performance can be obtained.

Second Modified Example

FIG. 4 is a schematic cross-sectional view for illustrating the structure of another modified example of the light-emitting device 100 according to the first embodiment. The light-emitting device 100B according to the second modified example is described referring to FIG. 4. In the present modified example, duplicative descriptions of the same structure as in the first embodiment described above may be omitted.

A difference between the light-emitting device 100B according to the second modified example and the light-emitting device 100 according to the first embodiment is that at least one covering member covers the light extracting surfaces of the light-emitting elements in the light-emitting device 100B according to the second modified example while the light extracting surfaces of the light-emitting elements are not covered with the covering member in the light-emitting device 100 according to the first embodiment.

Another difference between the light-emitting device 100B according to the second modified example and the light-emitting device 100 according to the first embodiment is that not only the first reflective member 40 but also the second reflective member 80 is disposed.

In FIG. 4, a covering member 31D covers the first element light extracting surface 201A of the first light-emitting element 20A, another covering member 31D covers the second element light extracting surface 201B of the second light-emitting element 20B, and even another covering member 31D covers the third element light extracting surface 201C of the third light-emitting element 20C. At least one of the first element light extracting surface 201A, the second element light extracting surface 201B, and the third element light extracting surface 201C is covered with a corresponding one or more of the at least one covering member 31D.

Each of the first element light extracting surface 201A of the first light-emitting element 20A, the second element light extracting surface 201B of the second light-emitting element 20B, and the third element light extracting surface 201C of the third light-emitting element 20C may be covered with a respective one of covering members 31D. Alternatively, respective two or more of may cover each of the first element light extracting surface 201A of the first light-emitting element 20A, the second element light extracting surface 201B of the second light-emitting element 20B, and the third element light extracting surface 201C of the third light-emitting element 20C may be covered by respective two or more of covering members 31D. The light extracting surface of each light-emitting element may be partially exposed from the covering member 31D, which allows for increasing light extraction efficiency of each light-emitting element.

The covering member 31D is located between the first element light extracting surface 201A of the first light-emitting element 20A and the light-guide member 60. Also, the covering member 31D is located between the second element light extracting surface 201B of the second light-emitting element 20B and the light-guide member 60. Also, the covering member 31D is located between the third element light extracting surface 201C of the third light-emitting element and the light-guide member 60. In this case, each of at least a portion of the first element lateral surfaces 202A, at least a portion of the second element lateral surfaces 202B, and at least a portion of the third element lateral surfaces 202C is preferably exposed from a respective one of the covering members 31D. This structure allows for preventing reduction of light emitted from the first light-emitting element 20A and traveling in the X direction and/or the Y direction, light emitted from the second light-emitting element 20B and traveling in the X direction and/or the Y direction, and light emitted from the third light-emitting element 20C and traveling in the X direction and/or the Y direction.

For a base material of the covering member 31D, a resin, such as a silicone resin, an epoxy resin, a phenolic resin, a polycarbonate resin, an acrylic resin, or a modified resin of these resins is preferably used. A silicone resin or a modified silicone resin has good heat and light resistance, and thus is particularly preferably used. Examples of the silicone resins include dimethyl silicone resins, phenyl-methyl silicone resins, and diphenyl silicone resins.

The covering member 31D preferably contains diffusing particles in the base material.

The covering member 31D containing the diffusing particles allows for reducing light emitted from the first light-emitting element 20A and traveling in the Z direction, light emitted from the second light-emitting element 20B and traveling in the Z direction, and light emitted from the third light-emitting element 20C and traveling in the Z direction, thereby increasing light traveling in the X direction and/or the Y direction. Light emitted from the first light-emitting element 20A, light emitted from the second light-emitting element 20B, and light emitted from the third light-emitting element 20C can be thus diffused in the light-guide member 60, so that the unevenness in emission color of the light-emitting device 100B can be reduced.

The covering member 31D may contain a wavelength conversion material in the base material. With the covering member 31D containing the wavelength conversion material, color control of the light-emitting device 100B can be facilitated. The wavelength conversion material contained in the covering member 31D may be the same as or different from the wavelength conversion material contained in the wavelength conversion layer 31B included in the light-transmissive member 30. For example, in the case where the peak emission wavelength of the second light-emitting element 20B is 490 nm or greater and 570 nm or less (i.e., green wavelength range), a CASN phosphor and/or a SCASN phosphor excited by light in the range of 490 nm or greater and 570 nm or less is preferably used for the wavelength conversion material. A phosphor such as $(Sr,Ca)LiAl_3N_4:Eu$ may also be used for the wavelength conversion material.

In the light-emitting device 100B according to the second modified example, the inclined members 50 are spaced apart from the light-transmissive member 30. With this structure, light emitted from the first light-emitting element, the second light-emitting element, and/or the third light-emitting element is not easily blocked by the inclined members 50, so that the light-emitting device 100B with improved color mixing performance can be obtained.

Third Modified Example

Figure 5:
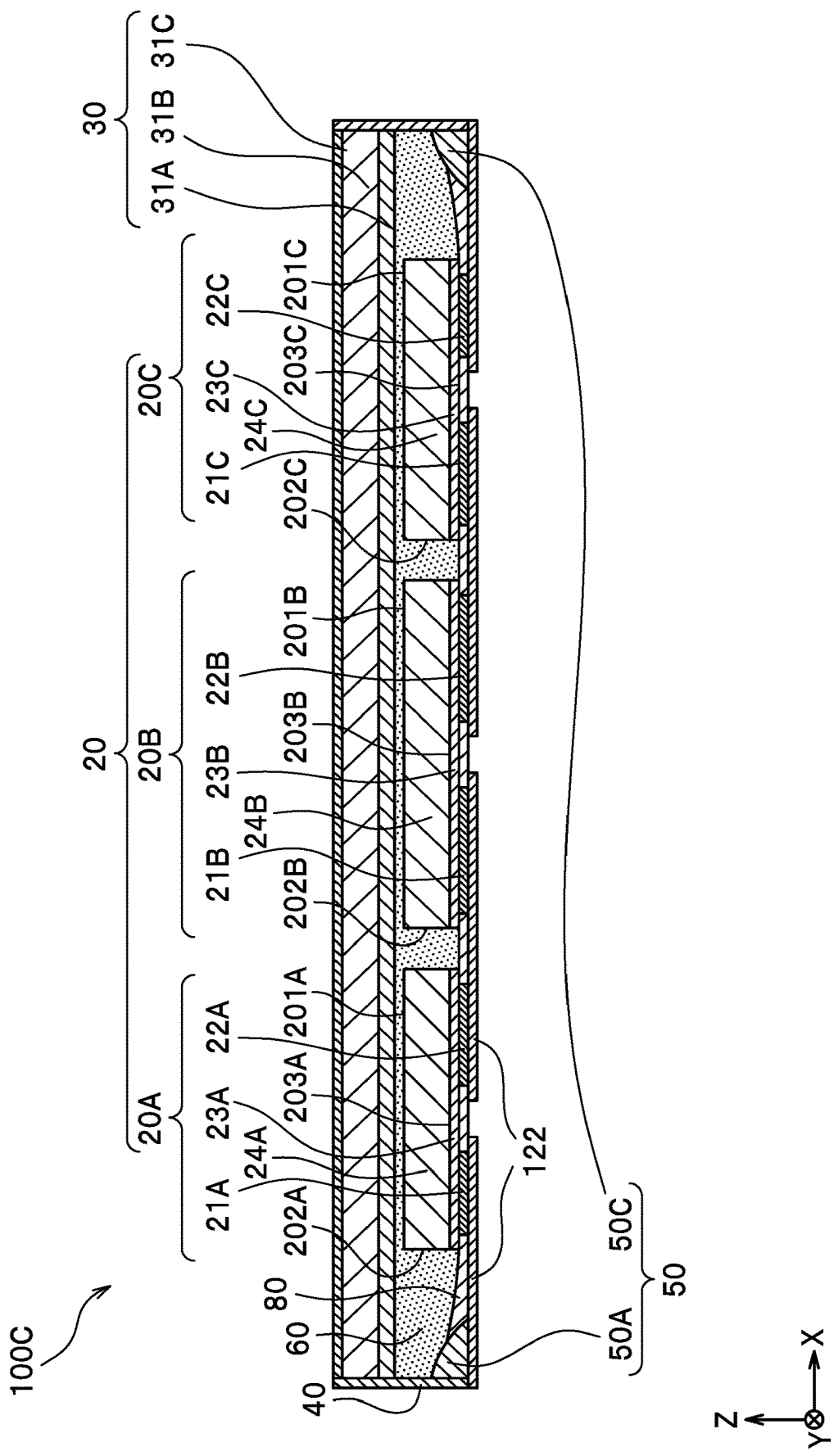
FIG. 5 is a schematic cross-sectional view of a third modified example of the light-emitting device according to the first embodiment of the present disclosure.

FIG. 5 is a schematic cross-sectional view for illustrating the structure of still another modified example of the light-emitting device 100 according to the first embodiment. The light-emitting device 100C according to the third modified example is described referring to FIG. 5. In the present modified example, duplicative descriptions of the same structure as in the first embodiment described above may be omitted.

A difference between the light-emitting device 100C according to the third modified example and the light-emitting device 100 according to the first embodiment is that the light-emitting device 100C according to the third modified example does not include the substrate 10 while the light-emitting device 100 according to the first embodiment includes the substrate 10.

Another difference between the light-emitting device 100C according to the third modified example and the light-emitting device 100 according to the first embodiment is that not only the first reflective member 40 but also the second reflective member 80 is disposed.

As in the light-emitting device 100C shown in FIG. 5, in the case of not including the substrate 10, on or above which the first light-emitting element 20A, the second light-emitting element 20B, and the third light-emitting element 20C are placed, a thickness of the light-emitting device 100C can be reduced in the Z direction.

Further, as in the light-emitting device 100C shown in FIG. 5, in the case of not including the substrate 10 on or above which the first light-emitting element 20A, the second light-emitting element 20B, and the third light-emitting element 20C are placed, the second reflective member 80 covering the first element electrode formation surface 203A, the second element electrode formation surface 203B, and the third element electrode formation surface 203C allows for reducing absorption of light emitted from the first light-emitting element 20A, light emitted from the second light-emitting element 20B, and light emitted from the third light-emitting element 20C into the mounting substrate, on which the light-emitting device 100C is mounted. This structure allows for increasing the light extraction efficiency of the light-emitting device 100C.

As in the light-emitting device 100C shown in FIG. 5, in the case of not including the substrate 10 on or above which the first light-emitting element 20A, the second light-emitting element 20B, and the third light-emitting element 20C are placed, the first light-emitting element 20A, the second light-emitting element 20B, and the third light-emitting element 20C are preferably connected via metal films 122 formed by sputtering or the like. With the metal films 122, the first light-emitting element 20A, the second light-emitting element 20B, and the third light-emitting element 20C can be electrically connected.

In the light-emitting device 100C according to the third modified example, the inclined members 50 are spaced apart from the light-transmissive member 30. With this structure, light emitted from the first light-emitting element, the second light-emitting element, and/or the third light-emitting element from can be prevented from being blocked by the inclined members 50, so that the light-emitting device 100C with improved color mixing performance can be obtained.

Fourth Modified Example

Figure 6:
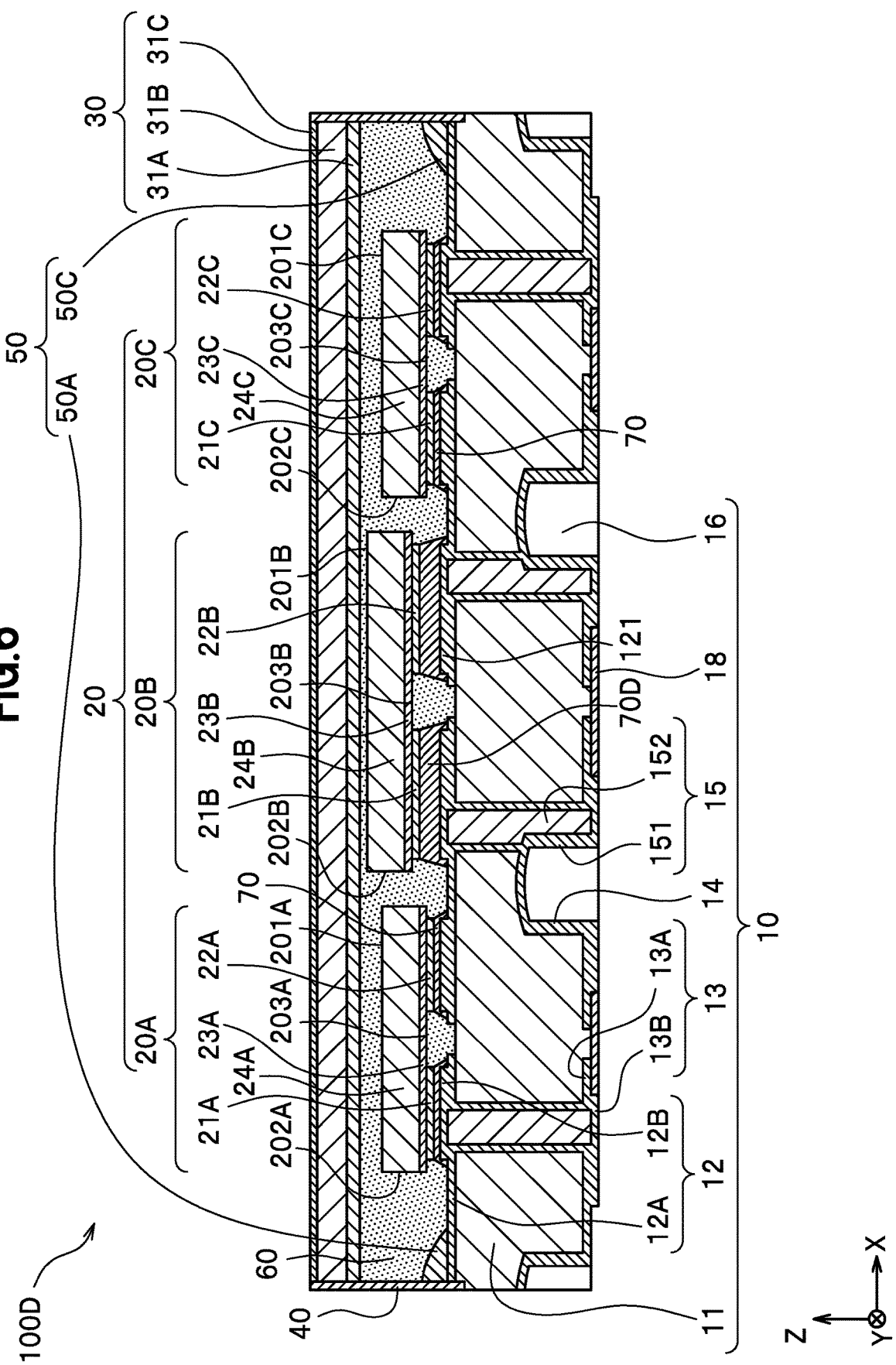
FIG. 6 is a schematic cross-sectional view of a fourth modified example of the light-emitting device according to the first embodiment of the present disclosure.

FIG. 6 is a schematic cross-sectional view for illustrating the structure of still another modified example of the light-emitting device 100 according to the first embodiment. The light-emitting device 100D according to the fourth modified example is described referring to FIG. 6. In the present modified example, duplicative descriptions of the same structure as in the first embodiment described above may be omitted.

In the light-emitting device 100D, the second light-emitting element 20B is mounted at a height different from a height at which the first light-emitting element 20A is mounted and a height at which the third light-emitting element 20C is mounted.

In the light-emitting device 100D, for example, an amount of a conductive adhesive member 70D for a corresponding one of the first light-emitting element 20A to the third light-emitting element 20C is different from amounts of conductive adhesive members 70 for the others of the first light-emitting element 20A to the third light-emitting element 20C, so that one of the first light-emitting element 20A to the third light-emitting element 20C is mounted at a height different from a height at which the other ones the others of the first light-emitting element 20A to the third light-emitting element 20C are mounted.

In the light-emitting device 100D, an amount of the conductive adhesive member 70D is different from amounts of the conductive adhesive members 70, so that the height from the first wiring 12 to the first element light extracting surface 201A and the third element light extracting surface 201C is different from the height from the first wiring 12 to the second element light extracting surface 201B. Further, in the light-emitting device 100D, the height of the light-guide member 60 is adjusted according to the height of the second element light extracting surface 201B, so that the first light-transmissive layer 31A is located higher than in the structure of the light-emitting device 100 shown in FIG. 2A.

In the light-emitting device 100D, as described above, one or more of the first light-emitting element 20A to the third light-emitting element 20C are mounted at height(s) different from height(s) at which the other(s) of the first light-emitting element 20A to the third light-emitting element 20C is mounted, reflection of light emitted from the lateral surfaces of each of the light-emitting elements 20A to 20C by the inclined members 50 or the like can be facilitated, so that light extraction efficiency can be increased.

In the light-emitting device 100D, one or more of a plurality of light-emitting elements are mounted at height(s) different from height(s) at which the other(s) of the plurality of light-emitting elements is mounted, and light-emitting elements other than the second light-emitting element 20*b* at the center may be mounted at height(s) different from height(s) at which the other light emitting element(s) is mounted. While the amount of the conductive adhesive members 70D is larger than the amounts of the other conductive adhesive members 70 in the description above so as to increase the height of the light extraction surface of a corresponding one of the light emitting elements, for example, providing a projection on the substrate 10 or disposing light-emitting elements having different heights also allows for varying heights of the light extraction surfaces of the light emitting elements. In the case where light-emitting elements having different heights are employed, employing semiconductor layered bodies including active layers with different heights allows for further increasing the light extraction efficiency. Because two or more light emitting elements can have different heights, the light emitting device 100D may include any appropriate number, two or more, of the light-emitting elements.

Method of Manufacturing Light-Emitting Device

Subsequently, a method of manufacturing the light-emitting device according to the first embodiment is described referring to FIG. 7 and FIG. 8A to FIG. 8H. In the method of manufacturing the light-emitting device according to the first embodiment, some steps may be performed in any appropriate order, and order of the steps may be changed.

As shown in FIG. 7, the method of manufacturing the light-emitting device according to the first embodiment includes Step S601 of mounting light-emitting elements, Step S602 of forming inclined members, Step S603 of forming a light-guide member, Step S604 of removing the light-guide member, Step S605 of forming a light-transmissive member, Step S606 of forming grooves, Step S607 of forming a first reflective member, Step S608 of removing the first reflective member, and Step S609 of singulating the light-emitting device.

Figure 8A:
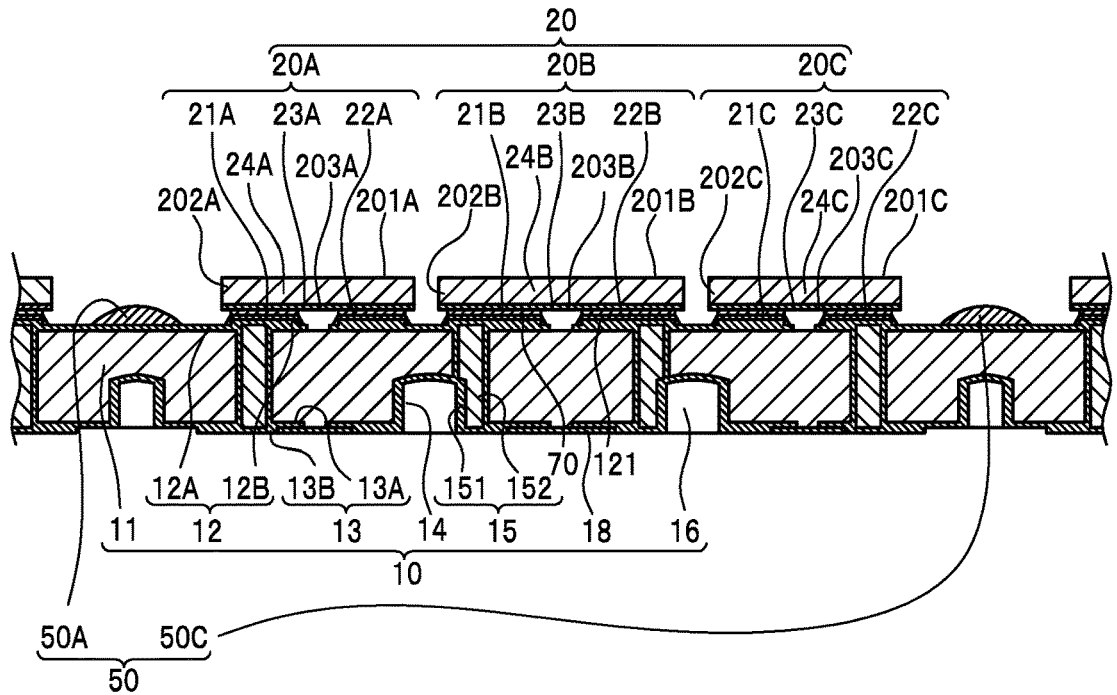
FIG. 8A is a schematic cross-sectional view illustrating mounting light-emitting elements and forming inclined members in the method for manufacturing the light-emitting device according to the first embodiment.

In Step S601 of mounting light-emitting elements, the first light-emitting element 20A (for example, a blue light-emitting element) having the first element light extracting surface 201A, the first element electrode formation surface 203A opposite to the first element light extracting surface, and the first element lateral surfaces 202A between the first element light extracting surface 201A and the first element electrode formation surface 203A is mounted on or above the substrate 10 as shown in FIG. 8A.

Further, the second light-emitting element 20B (for example, a green light-emitting element) having the second element light extracting surface 201B, the second element electrode formation surface 203B opposite to the second element light extracting surface, and the second element lateral surfaces 202B between the second element light extracting surface 201B and the second element electrode formation surface 203B is also mounted on or above the substrate 10.

Even further, the third light-emitting element 20C (for example, a blue light-emitting element) having the third element light extracting surface 201C, the third element electrode formation surface 203C opposite to the third element light extracting surface, and the third element lateral surfaces 202C between the third element light extracting surface 201C and the third element electrode formation surface 203C is also mounted on or above the substrate 10.

In this step, the light-emitting elements are preferably flip-chip mounted using the reflow method with solder.

In Step S602 of forming inclined members, the inclined members 50 (the first inclined member 50A and the second inclined member 50C) are formed on the substrate 10 as shown in FIG. 8A.

In this step, the first inclined member 50A is formed between the first light-emitting element 20A and the third light-emitting element of an adjacent light-emitting device, and the second inclined member 50C is formed between the third light-emitting element 20C and the first light-emitting element of an adjacent light-emitting device.

The first inclined member 50A is formed to have a thickness gradually increased in the Z direction along with increase in the distance from the first light-emitting element 20A or the third light-emitting element of the adjacent light-emitting device, that is, to have a so-called projected shape, and the second inclined member 50C is formed to have a thickness gradually increased in the Z direction along with increase in the distance from the third light-emitting element 20C or the first light-emitting element of the adjacent light-emitting device, that is, to have a so-called projected shape.

The first inclined member 50A and the second inclined member 50C can be formed using, for example, a transfer molding technique, an injection molding technique, a compression molding technique, or a potting technique.

In this step, the upper end of the first inclined member 50A is located between the first element light extracting surface 201A and the first element electrode formation surface 203A, and the upper end of the second inclined member 50C is located between the third element light extracting surface 201C and the third element electrode formation surface 203C.

With the inclined members spaced apart from the light-transmissive member, light emitted from the first light-emitting element 20A, the second light-emitting element 20B, and/or the third light-emitting element 30C can easily spread out in the X direction or the Y direction because. The light-emitting device 100 with improved color mixing performance can be thus obtained.

Figure 8B:
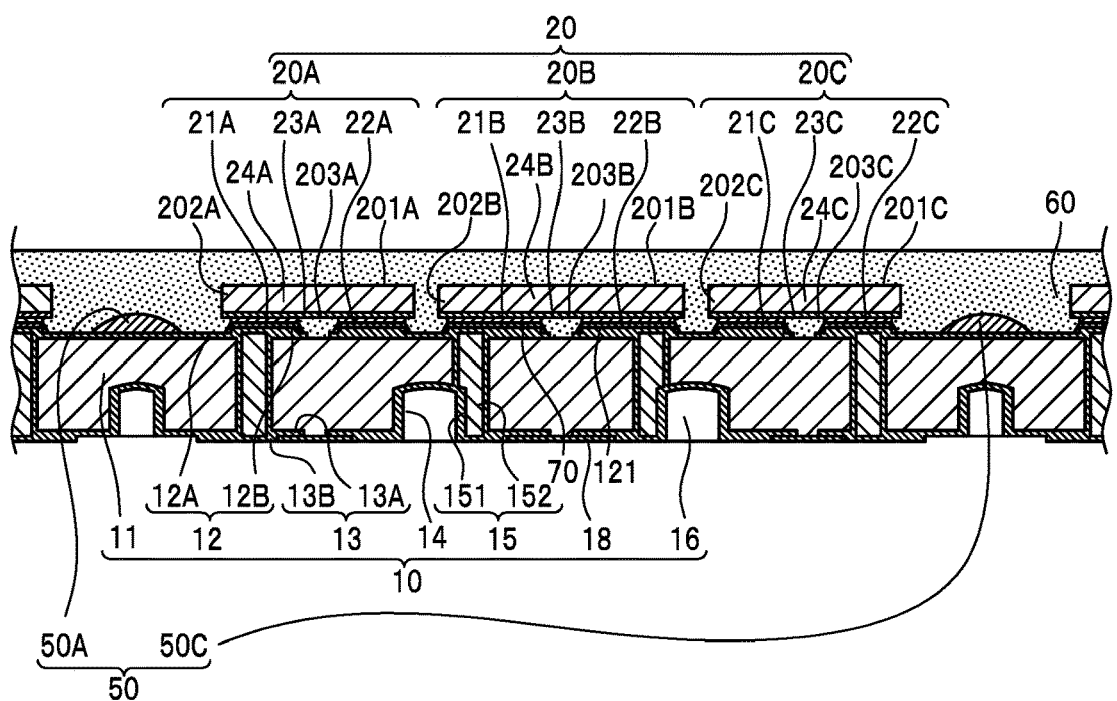
FIG. 8B is a schematic cross-sectional view illustrating forming a light-guide member in the method for manufacturing the light-emitting device according to the first embodiment.

In Step S603 of forming a light-guide member, the light-guide member 60 that covers the first element light extracting surface 201A and the first element lateral surfaces 202A of the first light-emitting element 20A, the second element light extracting surface 201B and the second element lateral surfaces 202B of the second light-emitting element 20B, and the third element light extracting surface 201C and the third element lateral surfaces 202C of the third light-emitting element 20C is formed as shown in FIG. 8B.

In this step, the light-guide member 60 is formed by, for example, dropping a liquid resin material containing the base material and the wavelength conversion material (i.e., second wavelength conversion material) onto the mounting surface on which the first light-emitting element 20A, the second light-emitting element 20B, and the third light-emitting element 20C have been mounted. Alternatively, the light-guide member 60 can be formed by, for example, applying the wavelength conversion material (second wavelength conversion material), by spraying, electrodeposition, or the like, to the mounting surface on which the first light-emitting element 20A, the second light-emitting element 20B, and the third light-emitting element 20C have been mounted, then dropping the base material onto the wavelength conversion material to impregnate the base material with the phosphor, and performing solidifying. The wavelength conversion material (second wavelength conversion material) may be located in a portion of the light-guide member 60 or in the entirety of the light-guide member 60.

Figure 8C:
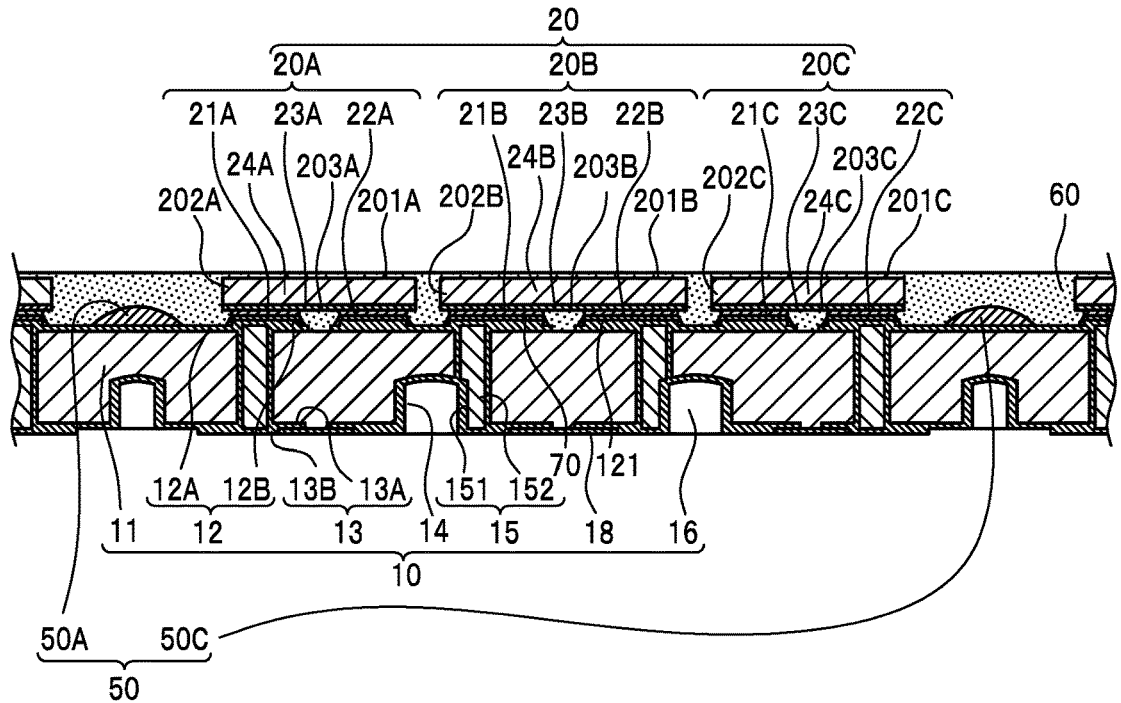
FIG. 8C is a schematic cross-sectional view illustrating removing the light-guide member in the method for manufacturing the light-emitting device according to the first embodiment.

In Step S604 of removing the light-guide member, a portion of the light-guide member 60 that covers the first element light extracting surface 201A and the first element lateral surfaces 202A of the first light-emitting element 20A, the second element light extracting surface 201B and the second element lateral surfaces 202B of the second light-emitting element 20B, and the third element light extracting surface 201C and the third element lateral surfaces 202C of the third light-emitting element 20C is removed as shown in FIG. 8C. By removing a portion of the light-guide member 60, the thickness of the light-guide member 60 can be adjusted to be a desired thickness. A portion of the light-guide member 60 can be removed using a known method such as grinding.

Figure 8D:
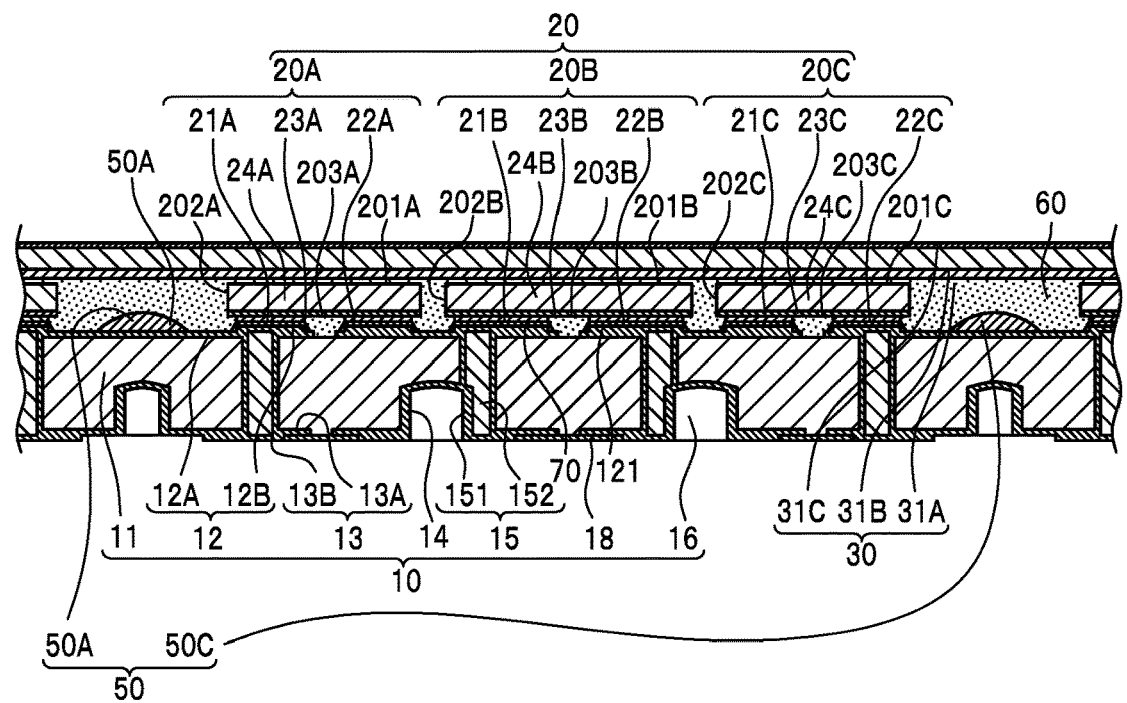
FIG. 8D is a schematic cross-sectional view illustrating forming a light-transmissive member in the method for manufacturing the light-emitting device according to the first embodiment.

In Step S605 of forming a light-transmissive member, the light-transmissive member 30 that covers the first element light extracting surface 201A of the first light-emitting element 20A, the second element light extracting surface 201B of the second light-emitting element 20B, and the third element light extracting surface 201C of the third light-emitting element 20C is formed such that a portion of the light-guide member 60 is located between the light-transmissive member 30 and each of the first element light extracting surface 201A, the second element light extracting surface 201B, and the third element light extracting surface 201C, as shown in FIG. 8D.

In this step, the first light-transmissive layer 31A is formed on the light-guide member 60, and the wavelength conversion layer 31B is formed on the first light-transmissive layer 31A, and the second light-transmissive layer 31C is then formed on the wavelength conversion layer 31B.

In this step, the first light-transmissive layer 31A is formed by, for example, applying a liquid resin material containing the base material and the first diffusing particles over the light-guide member 60 using a dispenser or the like and then curing the liquid resin material by heating or the like. In this step, the wavelength conversion layer 31B is formed by, for example, applying a liquid resin material containing the base material and the wavelength conversion material over the first light-transmissive layer 31A using a dispenser or the like and then curing the liquid resin material by heating or the like. In this step, the second light-transmissive layer 31C is formed by, for example, applying a liquid resin material containing the base material and the second diffusing particles over the wavelength conversion layer 31B using a dispenser or the like and then curing the liquid resin material by heat or the like. The viscosities and amounts of application of the liquid resin materials are appropriately adjusted such that the light-transmissive member 30 has the shape shown in FIG. 8D.

Figure 8E:
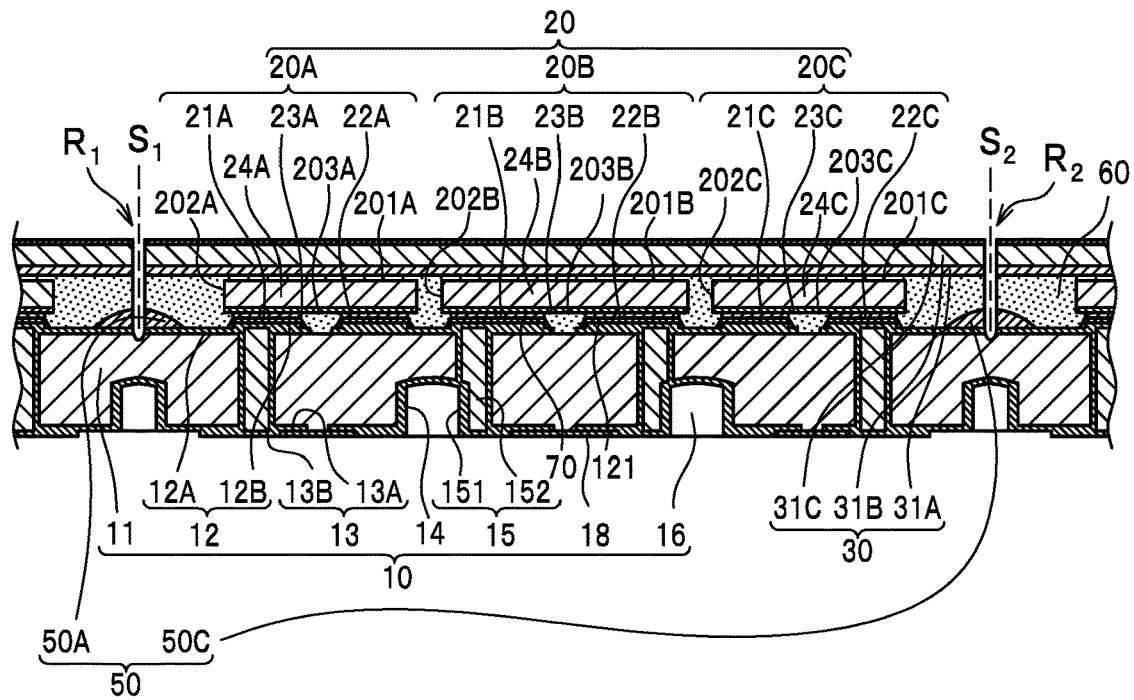
FIG. 8E is a schematic cross-sectional view illustrating forming grooves in the method for manufacturing the light-emitting device according to the first embodiment.

In Step S606 of forming grooves, a groove $R_1$ and a groove $R_2$ extending through the light-transmissive member 30 and the light-guide member 60 are formed as shown in FIG. 8E. The groove $R_1$ and/or the groove $R_2$ may extend through the inclined members 50.

In this step, the groove $R_1$ is formed by cutting the light-transmissive member 30, the light-guide member 60, and the inclined member 50 along a dashed line Si passing through the center of the first inclined member 50A using, for example, a blade dicing technique or a laser dicing technique. The groove $R_2$ is formed by cutting the light-transmissive member 30, the light-guide member 60, and the inclined member 50 along a dashed line $S_2$ passing through the center of the second inclined member 50C using, for example, a blade dicing technique or a laser dicing technique.

Forming the groove $R_1$ and the groove $R_2$ allows for precisely manufacturing the first reflective member 40 surrounding the first light-emitting element 20A, the second light-emitting element 20B, the third light-emitting element 20C, and the light-guide member 60 in a top view in the subsequent step. Each of the groove $R_1$ and the groove $R_2$ may have any appropriate shape, and may be, for example, a V-shaped groove or a U-shaped groove.

Figure 8F:
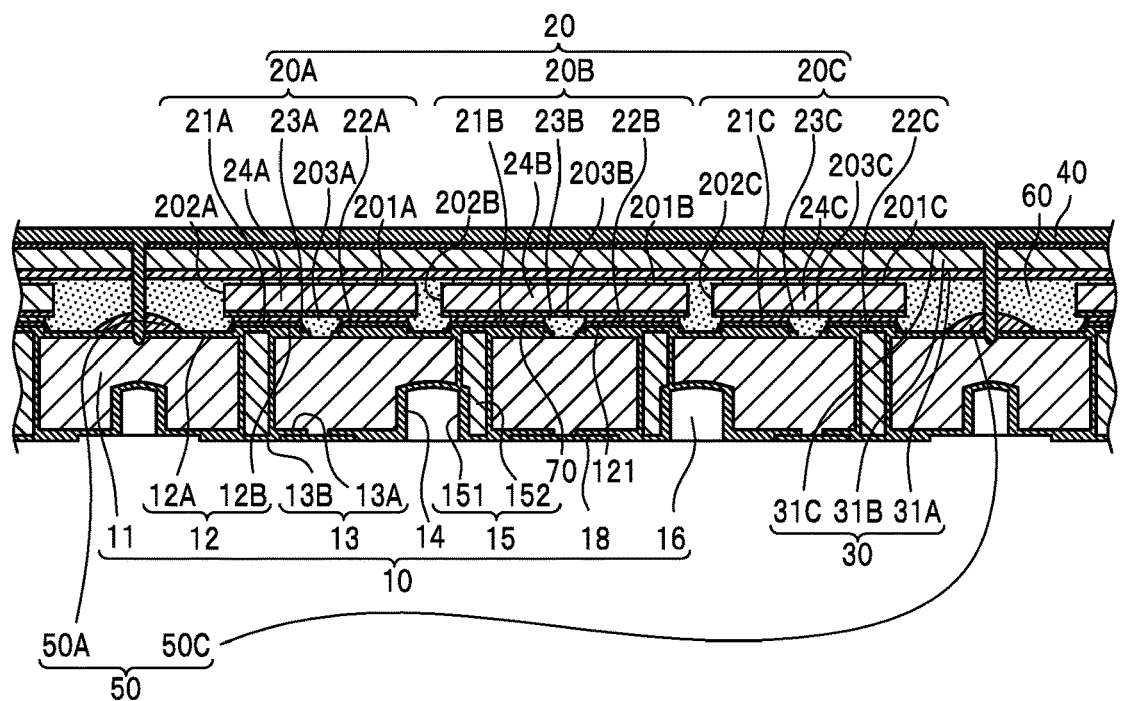
FIG. 8F is a schematic cross-sectional view illustrating forming a first reflective member in the method for manufacturing the light-emitting device according to the first embodiment.

In Step S607 of forming a first reflective member, the first reflective member 40 that surrounds the first light-emitting element 20A, the second light-emitting element 20B, the third light-emitting element 20C, and the light-guide member 60 is formed as shown in FIG. 8F.

In this step, the first reflective member 40 is formed by heating at a predetermined temperature for a predetermined period of time with a heating device such as a heater and a reflow oven to be cured.

Figure 8G:
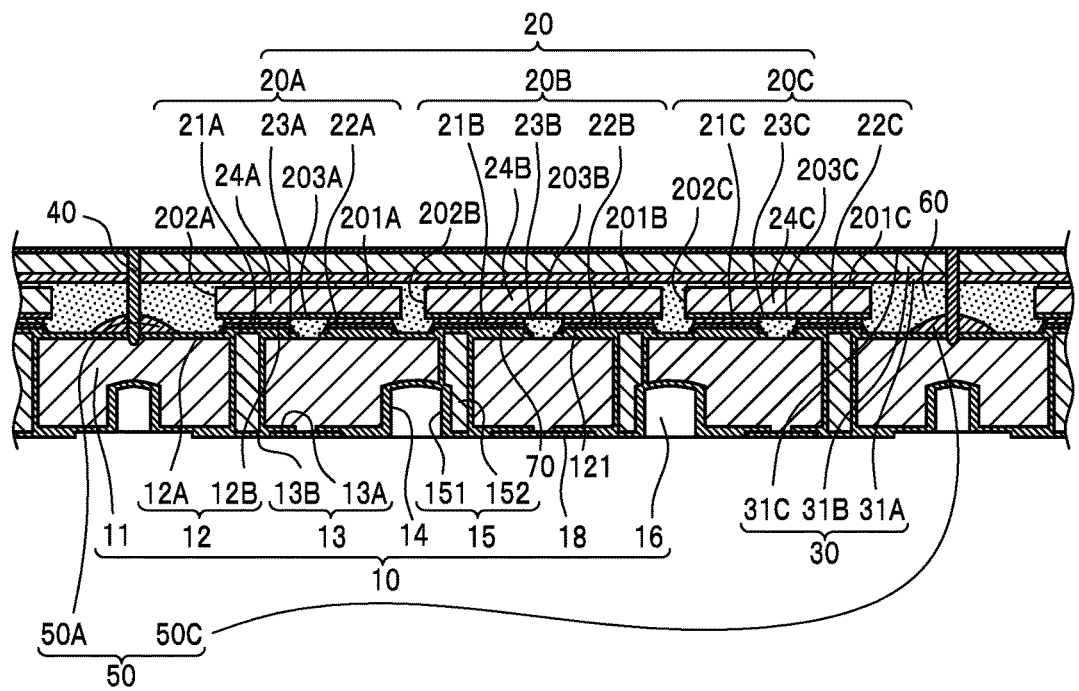
FIG. 8G is a schematic cross-sectional view illustrating removing the first reflective member in the method for manufacturing the light-emitting device according to the first embodiment.

In Step S608 of removing the first reflective member, a portion of the first reflective member 40 that surrounds the first light-emitting element 20A, the second light-emitting element 20B, the third light-emitting element 20C, and the light-guide member 60 is removed as shown in FIG. 8G. This step is performed to remove a portion the first reflective member 40 formed on the light-transmissive member 30. By removing a portion of the first reflective member 40 formed on the light-transmissive member 30, the light-transmissive member is exposed from the first reflective member 40. Accordingly, the first reflective member 40 covering the first element lateral surface 202A of the first light-emitting element 20A and the third element lateral surface 202C of the third light-emitting element 20C such that a portion of the light-guide member 60 is located between the first reflective member 40 and each of the first element lateral surface 202A and the third element lateral surface 202C and having a shape corresponding to the recess $R_1$ and the recess $R_2$ can be formed.

A portion of the first reflective member 40 can be removed using a known method such as grinding.

Figure 8H:
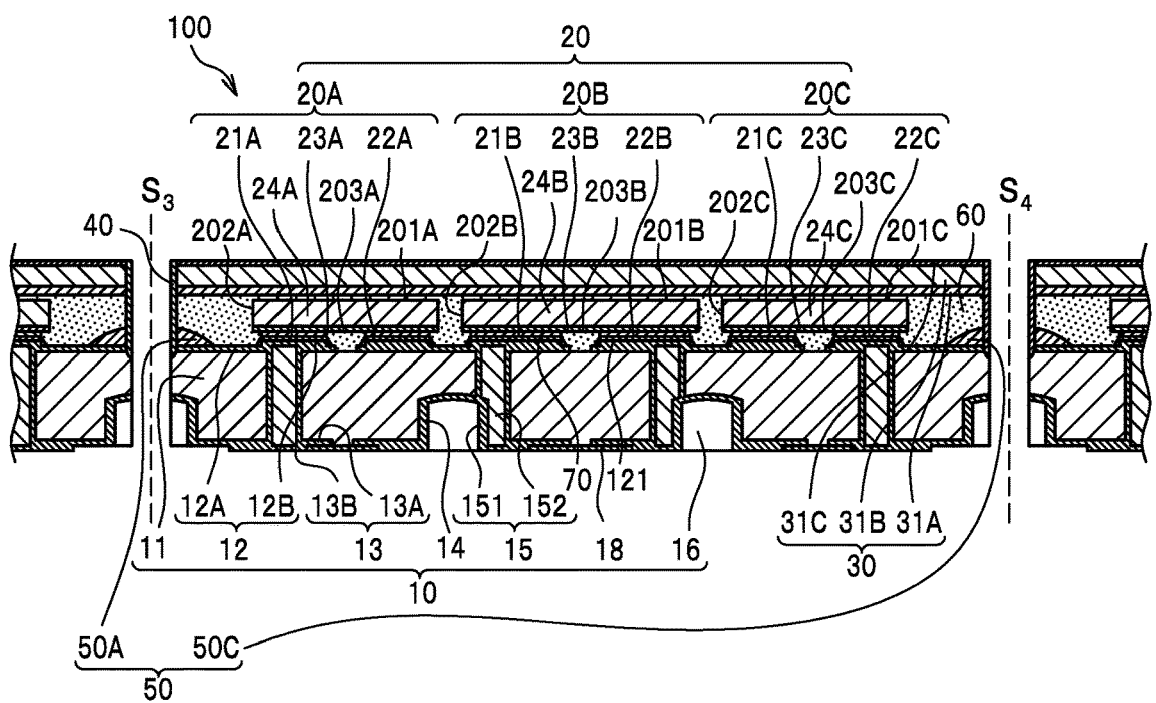
FIG. 8H is a schematic cross-sectional view illustrating singulating the light-emitting device in the method for manufacturing the light-emitting device according to the first embodiment.

In Step S609 of singulating the light-emitting device, the light-emitting device 100 is singulated along a dashed line $S_3$ and a dashed line $S_4$ as shown in FIG. 8H.

In this step, the light-emitting device 100 is singulated by cutting the first reflective member 40 and the substrate 10 along the dashed line $S_3$ and cutting the first reflective member 40 and the substrate 10 along the dashed line $S_4$ by, for example, blade dicing or laser dicing. In this step, the light-emitting device 100 is cut along the dashed line $S_3$ and the dashed line $S_4$ with a dicing saw or the like.

The light-emitting device 100 is manufactured through the steps as described above.

The steps described above are not necessarily performed in the order as described above. For example, Step S602 of forming inclined members may be performed before Step S601 of mounting light-emitting elements.

While certain embodiments of the present invention has been described above, but the scope of the present invention is not limited to these descriptions but should be broadly interpreted on the basis of the claims. Various changes and modifications of these descriptions are within the scope of the present invention.

A light-emitting device according to an embodiment of the present disclosure can be used for backlight devices for liquid-crystal displays, various lighting devices, light-emitting devices for vehicles, large sized displays, various displays for advertisements or destination guide, projectors, image scanners for digital video cameras, facsimile machines, copying machines, and scanners.

What is claimed is:

1. A light-emitting device having a longitudinal direction and a width direction perpendicular to the longitudinal direction, the light-emitting device comprising:
   a first light-emitting element having:
      a first element light extracting surface,
      a first element electrode formation surface opposite to the first element light extracting surface, and
      first element lateral surfaces between the first element light extracting surface and the first element electrode formation surface;
   a second light-emitting element having:
      a second element light extracting surface,
      a second element electrode formation surface opposite to the second element light extracting surface, and
      second element lateral surfaces between the second element light extracting surface and the second element electrode formation surface,
      the second light-emitting element having a peak emission wavelength different from a peak emission wavelength of the first light-emitting element and being aligned with the first light-emitting element in the longitudinal direction;
   a light-guide member covering the first element light extracting surface, the first element lateral surfaces, the second element light extracting surface, and the second element lateral surfaces;
   a light-transmissive member covering the first element light extracting surface and the second element light extracting surface such that a portion of the light-guide member is located between the light-transmissive member and each of the first element light extracting surface and the second element light extracting surface;
   a first reflective member surrounding the first light-emitting element, the second light- emitting element, and the light-guide member in a top view; and
   a first inclined member disposed between the first light-emitting element and the first reflective member in the longitudinal direction and having an inclined surface inclined relative to the light-transmissive member,
   wherein the first inclined member is spaced apart from the light-transmissive member, wherein the first inclined member is spaced apart from the first light-emitting element, and
   wherein, in the top view, the first inclined member aligns with the first light-emitting element in the longitudinal direction and completely does not align with the first light-emitting element in the width direction.

2. The light-emitting device according to claim 1, further comprising a second inclined member between the second light-emitting element and the first reflective member in the longitudinal direction.

3. The light-emitting device according to claim 1, wherein the first inclined member is in contact with the first reflective member.

4. The light-emitting device according to claim 1, wherein an upper end of the first inclined member is located between the first element light extracting surface and the first element electrode formation surface.

5. The light-emitting device according to claim 1, wherein the first inclined member contains a white pigment.

6. The light-emitting device according to claim 1, wherein the inclined surface of the first inclined member is a convex surface protruding toward the first light-emitting element.

7. The light-emitting device according to claim 1, wherein the light-transmissive member contains one or more wavelength conversion material.

8. The light-emitting device according to claim 7, wherein the peak emission wavelength of the first light-emitting element is 430 nm or greater and less than 490 nm, the peak emission wavelength of the second light-emitting element is 490 nm or greater and less than 570 nm, and a peak emission wavelength of at least one of the one or more wavelength conversion material is 580 nm or greater and less than 680 nm.

9. The light-emitting device according to claim 1, wherein the light-transmissive member further comprises:
   a first light-transmissive layer facing the first element light extracting surface and the second element light extracting surface;
   a wavelength conversion layer containing a first wavelength conversion material on the first light-transmissive layer; and
   a second light-transmissive layer on the wavelength conversion layer.

10. The light-emitting device according to claim 9, wherein the light-guide member contains a second wavelength conversion material.

11. The light-emitting device according to claim 10, wherein a peak emission wavelength of the second wavelength conversion material is 580 nm or more and less than 680 nm.

12. The light-emitting device according to claim 10, wherein a peak emission wavelength of the second wavelength conversion material is 515 nm or greater and less than 550 nm.

13. The light-emitting device according to claim 10, wherein a concentration of the second wavelength conversion material is higher at the inclined surface of the first inclined member than between the first light-emitting element and the second light-emitting element.

14. The light-emitting device according to claim 1, further comprising:
   a third light-emitting element having a peak emission wavelength different from the peak emission wavelength of the second light-emitting element and having:
      a third element light extracting surface,
      a third element electrode formation surface opposite to the third element light extracting surface, and
      third element lateral surfaces between the third element light extracting surface and the third element electrode formation surface; and
   a third inclined member between the third light-emitting element and the first reflective member in the longitudinal direction,
   wherein the light-guide member covers the first element light extracting surface, the first element lateral surfaces, the second element light extracting surface, the second element lateral surfaces, the third element light extracting surface, and the third element lateral surfaces,
   wherein the light-transmissive member covers the first element light extracting surface, the second element light extracting surface, and the third element light extracting surface such that the light-guide member is disposed between the light-transmissive member and each of the first element light extracting surface, the second element light extracting surface, and the third element light extracting surface, and
   wherein the first reflective member surrounds the first light-emitting element, the second light-emitting element, the third light-emitting element, and the light-guide member in the top view.

15. The light-emitting device according to claim 14, wherein the second light-emitting element is located between the first light-emitting element and the third light-emitting element.

16. The light-emitting device according to claim 14, wherein the peak emission wavelength of the third light-emitting element is equal to the peak emission wavelength of the first light-emitting element.

17. The light-emitting device according to claim 1, further comprising:
   a substrate on or above which the first light-emitting element and the second light-emitting element are disposed; and
   a second reflective member between the first element electrode formation surface and an upper surface of the substrate.

18. The light-emitting device according to claim 2, wherein, in the top view, the second inclined member aligns with the second light-emitting element in the longitudinal direction, and the second inclined member completely does not align with the second light-emitting element in the width direction.

19. A light-emitting device having a longitudinal direction and a width direction perpendicular to the longitudinal direction, the light-emitting device comprising:
   a first light-emitting element having:
      a first element light extracting surface,
      a first element electrode formation surface opposite to the first element light extracting surface, and
      first element lateral surfaces between the first element light extracting surface and the first element electrode formation surface;
   a second light-emitting element having:
      a second element light extracting surface,
      a second element electrode formation surface opposite to the second element light extracting surface, and
      second element lateral surfaces between the second element light extracting surface and the second element electrode formation surface,
      the second light-emitting element having a peak emission wavelength different from a peak emission wavelength of the first light-emitting element and being aligned with the first light-emitting element in the longitudinal direction;
   a light-guide member covering the first element light extracting surface, the first element lateral surfaces, the second element light extracting surface, and the second element lateral surfaces;
   a light-transmissive member covering the first element light extracting surface and the second element light extracting surface such that a portion of the light-guide member is located between the light-transmissive member and each of the first element light extracting surface and the second element light extracting surface;
   a first reflective member surrounding the first light-emitting element, the second light-emitting element, and the light-guide member in a top view;
   a first inclined member disposed between the first light-emitting element and the first reflective member in the longitudinal direction and having an inclined surface inclined relative to the light-transmissive member; and
   a second inclined member between the second light-emitting element and the first reflective member in the longitudinal direction,
   wherein the first inclined member is spaced apart from the light-transmissive member, wherein the first inclined member is spaced apart from the first light-emitting element, and
   wherein, in the top view, the first inclined member and the second inclined member completely do not align with the first light-emitting element and the second light-emitting element in the width direction.

* * * * *